United States Patent
Moriwaki

(10) Patent No.: US 10,885,982 B2
(45) Date of Patent: Jan. 5, 2021

(54) SEMICONDUCTOR MEMORY DEVICE AND CONTROL METHOD THEREFOR

(71) Applicant: SOCIONEXT INC., Kanagawa (JP)

(72) Inventor: Shinichi Moriwaki, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 16/511,604

(22) Filed: Jul. 15, 2019

(65) Prior Publication Data

US 2020/0043554 A1 Feb. 6, 2020

(30) Foreign Application Priority Data

Aug. 2, 2018 (JP) .................................. 2018-145675

(51) Int. Cl.
*G11C 15/04* (2006.01)
*G11C 7/06* (2006.01)

(52) U.S. Cl.
CPC .............. *G11C 15/04* (2013.01); *G11C 7/062* (2013.01); *G11C 7/06* (2013.01); *G11C 7/065* (2013.01)

(58) Field of Classification Search
CPC ............ G11C 7/062; G11C 7/06; G11C 7/065
See application file for complete search history.

(56) References Cited

U.S. PATENT DOCUMENTS

| 7,009,862 | B2 | 3/2006 | Higeta et al. | |
|---|---|---|---|---|
| 9,502,112 | B2 | 11/2016 | Nii | |
| 2005/0201132 | A1* | 9/2005 | Shin | G11C 15/04 711/108 |
| 2009/0268535 | A1* | 10/2009 | Kim | G11C 7/08 365/203 |
| 2016/0027495 | A1* | 1/2016 | Kim | G11C 11/4074 365/149 |

FOREIGN PATENT DOCUMENTS

| JP | 2005-197345 A | 7/2005 |
|---|---|---|
| JP | 2005-259341 A | 9/2005 |
| JP | 2011-096363 A | 5/2011 |
| JP | 2016-157500 A | 9/2016 |

* cited by examiner

*Primary Examiner* — Han Yang
(74) *Attorney, Agent, or Firm* — McDermott Will and Emery LLP

(57) ABSTRACT

A semiconductor memory device includes a memory cell including a first memory unit and a second memory unit which are coupled to a complementary bit line pair, an operation controller configured to successively select the first memory unit and the second memory unit, during a read operation which reads data from the memory cell, a first readout unit coupled to one of the bit line pair, and configured to judge a logical value of the data read from the selected first memory unit onto the one of the bit line pair, and a second readout unit coupled to the other of the bit line pair, and configured to judge a logical value of the data read from the selected second memory unit onto the other of the bit line pair.

15 Claims, 12 Drawing Sheets

FIG.5

| | WLD | WLM | BL | BLX | SL | SLX | DT | MSK | ML | NOTE |
|---|---|---|---|---|---|---|---|---|---|---|
| WRITE OPERATION | H | - | L | H | L | L | L | No change | H | DT: Write "L" |
| | H | - | H | L | L | L | H | No change | H | DT: Write "H" |
| | H | - | H | H | L | L | No change | No change | H | BE="L" (Partial) |
| | L | H | L | H | L | L | No change | L | H | MSK: Write "L" |
| | L | H | H | L | L | L | No change | H | H | MSK: Write "H" |
| | L | H | H | H | L | L | No change | No change | H | BE="L" (Partial) |
| READ OPERATION | H | L | (L) | PCH | L | L | No change | No change | H | DT: Read "L" |
| | H | L | (H) | PCH | L | L | No change | No change | H | DT: Read "H" |
| | L | H | PCH | (H) | L | L | No change | No change | H | MSK: Read "L" |
| | L | H | PCH | (L) | L | L | No change | No change | H | MSK: Read "H" |
| COMPARE OPERATION | L | L | H | H | L | H | L | L | H | Always match |
| | L | L | H | H | L | H | L | H | H | "L" match |
| | L | L | H | H | L | H | H | L | L | "L" mismatch |
| | L | L | H | H | L | H | H | H | L | Unused |
| | L | L | H | H | H | L | L | L | H | Always match |
| | L | L | H | H | H | L | L | H | L | "H" mismatch |
| | L | L | H | H | H | L | H | L | H | "H" match |
| | L | L | H | H | H | L | H | H | L | Unused |
| | L | L | H | H | L | L | - | - | H | Always match |
| STANDBY | L | L | L | L | L | L | No change | No change | H | Standby mode |

SEMICONDUCTOR MEMORY DEVICE AND CONTROL METHOD THEREFOR

CROSS-REFERENCE TO RELATED APPLICATION

This application is based upon and claims the benefit of priority of the prior Japanese Patent Application No. 2018-145675, filed on Aug. 2, 2018, the entire contents of which are incorporated herein by reference.

FIELD

Certain aspects of the embodiments discussed herein are related to a semiconductor memory device and a control method therefor.

BACKGROUND

A known Content Addressable Memory (CAM) retrieves a storage area based on input data, and outputs an address indicating the storage area which stores data. In addition, a known Ternary CAM (TCAM) can be set to always judge a match without regarding a portion of the bits of the data as a comparison target. Examples of such memories are described in Japanese Laid-Open Patent Publications No. 2005-197345, No. 2005-259341, and No. 2016-157500, for example.

A memory cell of the TCAM includes a pair of Static Random Access Memory (SRAM) cells connected to a common bit line pair, for example. The SRAM cells of the pair are connected to mutually different word lines, and are connected to one and the other of a complementary search line pair, respectively. In addition, the memory cell of the TCAM includes a comparator unit which compares a logical value (search data) supplied to the search line pair and information stored in the pair of SRAM cells, and outputs a comparison result to a match line. Each memory cell stores one of a logical value "0", a logical value "1", and a value indicating that a portion of the bits of the data is not the not comparison target, according to a value written in the pair of SRAM cells.

In the TCAM described above, the pair of SRAM cells within the memory cell is connected to the common bit line pair, and is connected to mutually different word lines. For this reason, a read operation to read the data from the memory cell is performed by successively driving the word line connected to each of the pair of SRAM cells, and successively reading complementary data from the SRAM cells onto the bit line pair. Similarly, a write operation to write the data to the memory cell is performed by successively driving the word line connected to each of the pair of SRAM cells, and successively supplying the complementary data to the bit line pair. Hence, the read operation of the memory cell includes two read cycles, and the write operation of the memory cell includes two write cycles.

In addition, in the SRAM cell, the bit line pair needs to be precharged before the read operation and before the write operation. The read cycle includes a read period in which the data is read from the SRAM cells onto the bit line pair, and a precharge period in which the bit line pair is precharged. The write period includes a write period in which the data is written to the SRAM cells via the bit line pair, and a precharge period in which the bit line pair is preharged. In addition, the larger the number of words storable in the TCAM, the longer the bit line pair becomes, and the longer a prechage time of the bit line pair becomes.

SUMMARY

Accordingly, it is an object in one aspect of the embodiments to improve an access performance of the semiconductor memory device having a memory cell including a first memory unit and a second memory unit.

According to one aspect of the embodiments, a semiconductor memory device includes a memory cell including a first memory unit and a second memory unit which are coupled to a complementary bit line pair; an operation controller configured to successively select the first memory unit and the second memory unit, during a read operation which reads data from the memory cell; a first readout unit coupled to one of the bit line pair, and configured to judge a logical value of the data read from the selected first memory unit onto the one of the bit line pair; and a second readout unit coupled to the other of the bit line pair, and configured to judge a logical value of the data read from the selected second memory unit onto the other of the bit line pair.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIG. 5 is a diagram illustrating an example of a truth table for explaining an example of the operation of the semiconductor memory device illustrated in FIG. 3;

DESCRIPTION OF EMBODIMENTS

Figure 1:
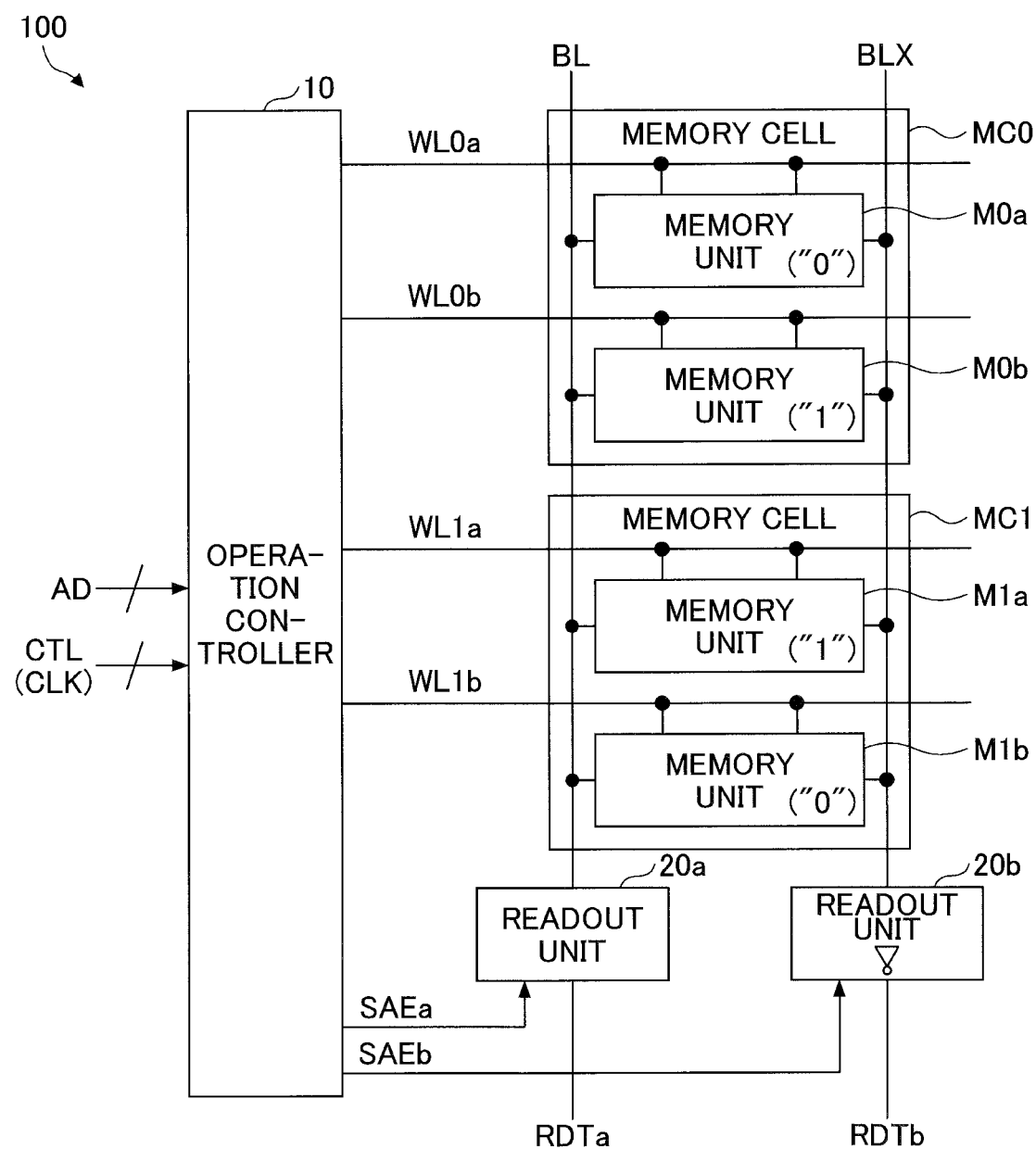
FIG. 1 is a diagram illustrating an example of a semiconductor memory device according to a first embodiment.

Preferred embodiments of the present invention will be described with reference to the accompanying drawings. In the drawings, those parts that are the same are designated by the same reference numerals, and a repeated description of the same parts may be omitted. Signal lines on which signals are transferred may be designated by names of the signals. In addition, the names of the signal lines affixed by a symbol "X" indicate negative logic.

A description will now be given of embodiments of a semiconductor memory device and a control method therefor.

FIG. 1 is a diagram illustrating an example of a semiconductor memory device according to a first embodiment. A semiconductor memory device 100 illustrated in FIG. 1 has a memory cell MC (MC0 or MC1) including two memory units Ma (M0a or M1a) and Mb (M0b or M1b), an operation controller 10, and a readout unit 20 (20a and 20b). The memory cells MC0 and MC1 have mutually identical circuit configurations, and the memory units Ma and Mb have mutually identical circuit configurations. The memory units M0a and M1a are an example of a first memory unit, and the memory units M0b and M1b are an example of a second memory unit. The readout unit 20a is an example of a first readout unit, and the readout unit 20b is an example of a second readout unit.

For example, the semiconductor memory device 100 may be a TCAM included in a Central Processing Unit (CPU) or the like, and may be used for a Translation Lookaside Buffer (TLB) which converts a virtual address into a physical address. In FIG. 1, illustration of a search line and a match line which are connected to the memory cells MC0 and MC1 of the TCAM, and a control circuit which controls the search (comparison) of the data, is omitted for the sake of convenience. The memory cell MC includes two memory units Ma and Mb for holding a logical value indicating an indefinite value, in addition to storing a logical value "0" and a logical value "1" for comparing with a logical value of the comparison data transferred on the search line. In a case where the logical value indicating the indefinite value is held in the memory cell MC, the match line is set to a logical value indicating a match, regardless of the logical value of the comparison data. In other words, the logical value indicating the indefinite value is a logical value indicating "always match".

The memory unit M0a is connected to a word line WL0a and a complementary bit line pair BL and BLX. The memory unit M0b is connected to a word line WL0b and the complementary bit line pair BL and BLX. The memory unit M1a is connected to a word line WL1a and the complementary bit line pair BL and BLX. The memory unit M1b is connected to a word line WL1b and the complementary bit line pair BL and BLX.

The readout unit 20a is connected to the bit line BL, and the readout unit 20b is connected to the bit line BLX. In the following description, each of the word lines WL0a and WL1a may also be referred to as a word line WLa or a word line WL, and each of the word lines WL0b and WL1b may also be referred to as a word line WLb or a world line WL.

Figure 4:
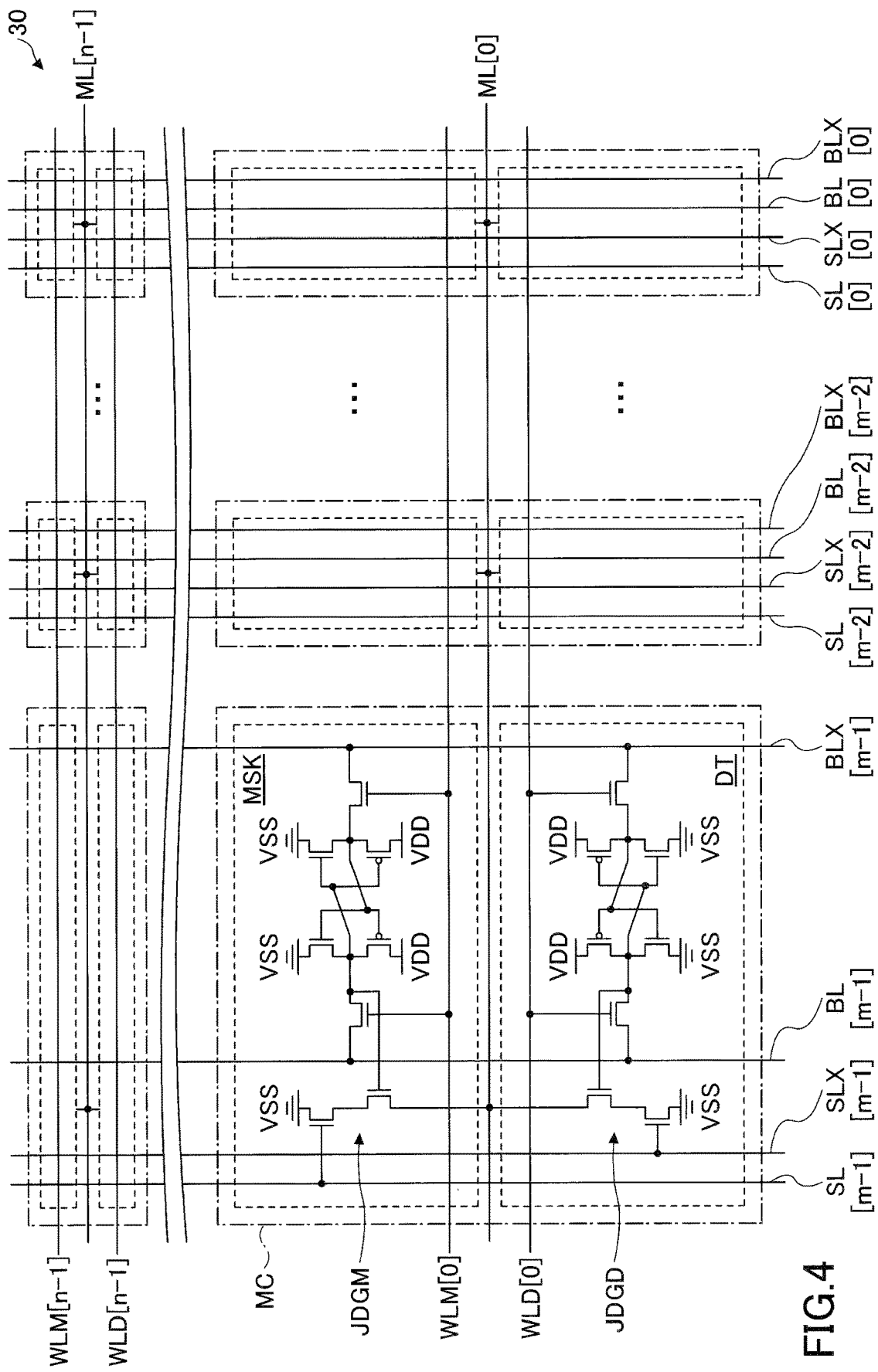
FIG. 4 is a diagram illustrating an example of a memory cell illustrated in FIG. 3.

For example, each of the memory units Ma and Mb includes two inverter circuits which are not illustrated, and an output of one of the inverter circuits is connected to an input of the other of the inverter circuits. Output nodes of the two inverter circuits form complementary memory nodes for holding complementary data supplied to the memory unit Ma (or Mb) via the bit line pair BL and BLX. Each of the memory units Ma and Mb includes a SRAM cell which is a memory cell of the SRAM, however, each of the memory units Ma and Mb is not limited to such a memory cell. An example of the SRAM cell is illustrated in FIG. 4. For example, each complementary memory node of each memory unit Ma (or Mb) is connected to one or the other of the bit line pair BL and BLX via a switching circuit such as a transfer transistor or the like having a gate connected to the word line WLa (or WLb).

In FIG. 1, "0" and "1" indicated in brackets within the block of each of the memory units Ma and Mb indicate the logical values held in each of the memory units Ma and Mb. The logical value held in each of the memory units Ma and Mb is equal to the logical value held by the memory node connected to the bit line BL. Each of the memory units Ma and Mb may use a memory cell other than the SRAM cell, as long as each of the memory units Ma and Mb forms a circuit for storing complementary logical values in the complementary memory nodes connected to the bit line pair BL and BLX.

The operation controller 10 controls a read operation or controls a write operation, based on an address signal AD and various kinds of control signals CTL supplied from outside the semiconductor memory device 100. In a case where the semiconductor memory device 100 is a synchronous type, the control signals CTL include a clock signal CLK. In FIG. 1 and other relevant figures, a symbol "/" indicated above a signal line indicates that the signal line includes a plurality of bits.

The operation controller 10 drives one of the word lines WL0a, WL0b, WL1a, and WL1b connected to the memory units M0a, M0b, M1a, and M1b to be accessed, to a selection level, based on the logical value of the address signal AD. The access is either a read access which reads the data from the memory cell MC, or a write access which writes the data to the memory cell MC. For example, the selection level of the word line WL is a power supply voltage, or a high level higher than the power supply voltage. In the following description, driving the word line WL to the selection level may also be referred to as activating the word line WL, and driving the word line WL to a non-selection level may also be referred to as deactivating the word line WL.

The operation controller 10, when performing the read access, outputs a read control signal SAEa (or SAEb) to the readout unit 20 corresponding to the memory unit Ma (or Mb) connected to the activated word line WL, and operates the readout unit 20. For example, by the activation of the word line WL0a, the complementary memory nodes of the memory unit M0a are respectively connected to the bit lines BL and BLX, and the data read from the memory unit M0a or the data write to the memory unit M0a is performed. Similarly, by driving the word line WL0b, the complementary memory nodes of the memory unit M0b are respectively connected to the bit lines BL and BLX, and the data read from the memory unit M0b or the data write to the memory unit M0b is performed. In FIG. 1, illustration of a write unit for writing the data to the memory MC is omitted.

The readout unit 20a judges a logical value of the data read onto the bit line BL from the memory unit Ma in response to the activation of the word line WLa, based on the read control signal SAEa, and outputs a read data signal RDTa indicating the judged logical value. The readout unit 20b judges a logical value of the data read onto the bit line BLX from the memory unit Mb in response to the activation of the word line WLb, based on the read control signal SAEb, and outputs a read data signal RDTb indicating the judged logical value. For example, the readout unit 20a judges the logical value of the data read onto the bit line BL, by differentially amplifying a potential difference between a voltage of the bit line BL and a reference voltage. The readout unit 20b judges the logical value of the data read onto the bit line BLX, by differentially amplifying a potential difference between a voltage of the bit line BLX and the reference voltage.

For example, the readout unit 20b includes an inverter circuit for inverting the logical value of the data transferred on the bit line BLX, so as to match the logical values (positive logic or negative logic) of the read data signals RDTa and RDTb. The readout unit 20b may be operated during the read operation of the memory unit M0a (or M1a), and the readout unit 20a may be operated during the read operation of the memory unit M0b (or M1b). Also in this case, the operation controller 10 performs the data read from the memory units Ma and Mb within the memory cell MC, respectively, using mutually different readout units 20a and 20b.

Figure 2:
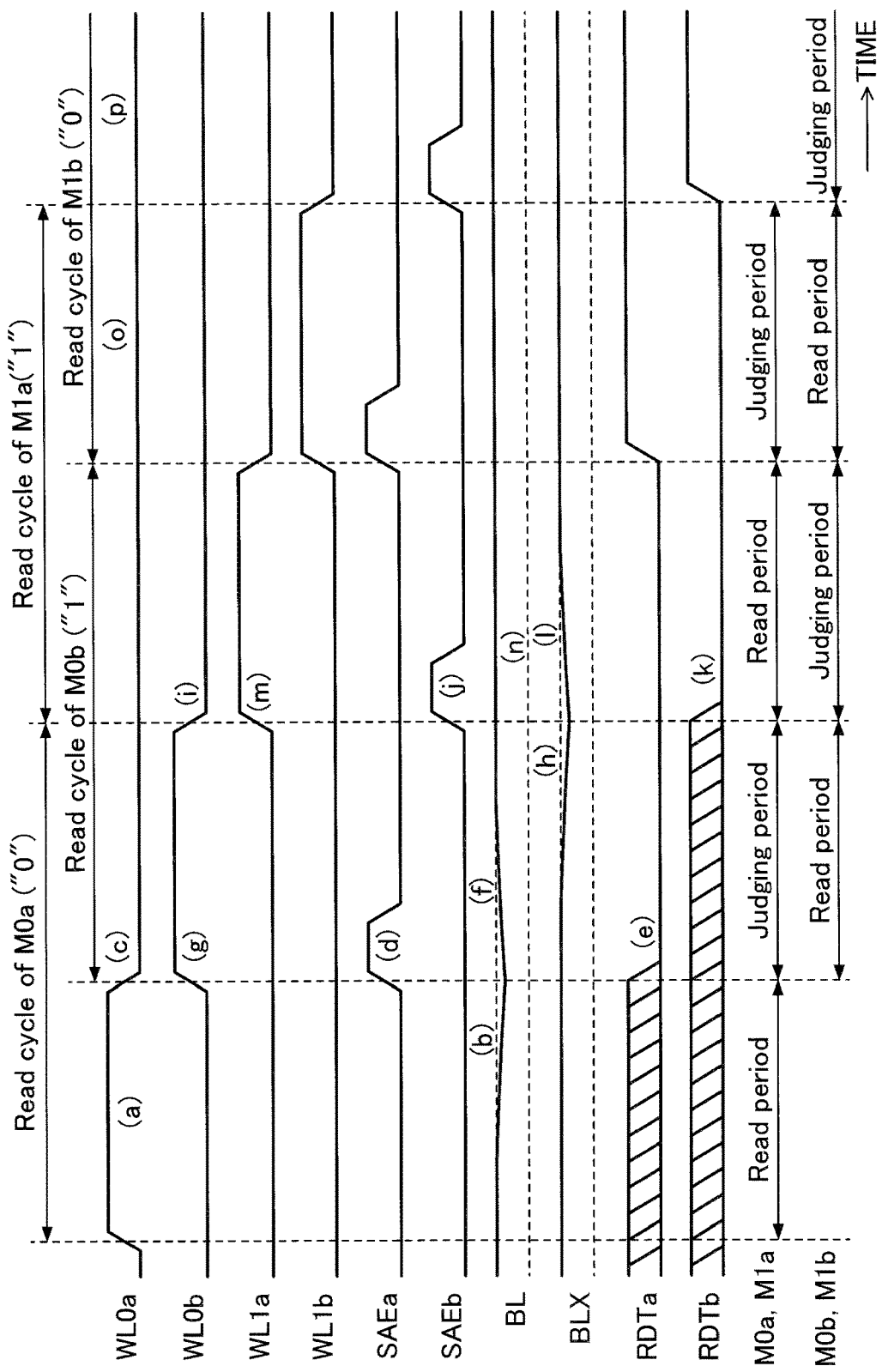
FIG. 2 is a diagram for explaining an example of an operation of the semiconductor memory device illustrated in FIG. 1.

FIG. 2 is a diagram for explaining an example of an operation of the semiconductor memory device 100 illustrated in FIG. 1. In other words, FIG. 2 illustrates an example of a control method for controlling the semiconductor memory device 100. In the example illustrated in FIG. 2, the read operations of the memory cells MC0 and MC1 are successively performed. The operation controller 10 performs a control to successively read the data from the memory units M0a and M0b, based on receiving the control signal CTL indicating a read command, together with the address signal AD indicating the memory cell MC0. Similarly, the operation controller 10 performs a control to successively read the data from the memory units M1a and M1b, based on receiving the control signal CTL indicating the read command, together with the address signal AD indicating the memory cell MC1. The readout units 20a and 20b set the bit line BL (or BLX), which is used for the read operation, to a precharge voltage (that is, high level), before each read operation starts (for example, in a latter half of an immediately preceding read cycle).

First, the operation controller 10 activates the word line WL0a as illustrated in FIG. 2 by (a), in order to read the data from the memory unit M0a of the memory cell CM0. By the activation of the word line WL0a, the memory node (storing the logical value "0") on the bit line BL side of the memory unit M0a is connected to the bit line BL, and the memory node (storing the logical value "1") on the bit line BLX side of the memory unit M0a is connected to the bit line BLX. Because the logical value "0" is read from the memory unit M0a, the voltage o the bit line gradually decreases from the precharge voltage, as illustrated in FIG. 2 by (b). The operation controller 10, after a predetermined time, deactivates the word line WL0a, and outputs the read control signal SAEa (that is, a pulse signal having a high level), as illustrated in FIG. 2 by (c) and (d), respectively. For example, the predetermined time is one-half the read cycle.

The operation controller 10 sets the read control signal SAEa to a high level at a timing when the word line WL0a is deactivated, for example. The readout unit 20a judges the logical value of the data read onto the bit line BL, during the high-level period of the read control signal SAEa, and generates a read data signal RDTa (having a low level) indicating the judged logical value, as illustrated in FIG. 2 by (e). Because a read data line RDTa and the bit line BL are electrically isolated, the level of the read data signal RDTa will not be transferred to the bit line BL. For example, the readout unit 20a starts the precharge of the bit line BL after the logical value of the read data signal RDTa becomes definite. By the precharge operation, the bit line BL gradually rises up to the power supply voltage, for example, as illustrated in FIG. 2 by (f).

The operation controller 10 activates the word line WL0b in correspondence with the deactivation of the word line WL0a, as illustrated in FIG. 2 by (g). By the activation of the word line WL0b, the memory node (storing the logical value "0") on the bit line BLX side of the memory unit M0b is connected to the bit line BLX, and the memory node (storing the logical value "1") on the bit line BL side of the memory unit M0b is connected to the bit line BL. Because the memory unit M0b stores the logical value "1", the logical value "0" is read from the memory unit M0b onto the bit line BLX, and the voltage of the bit line BLX gradually decreases from the precharge voltage, as illustrated in FIG. 2 by (h).

The amount of decrease of the voltage of the bit line BL at the time when the logical value "0" is read from the memory unit M0a is smaller than a threshold voltage of the transfer transistor of the memory cell MC, for example. For this reason, even in a case where the word line WL0b is activated before the bit line BL is precharged, the voltage of the bit line BL will not be transferred within the memory unit M0b, and the data stored in the memory unit M0b will not be destroyed.

The operation controller 10, after the predetermined time, deactivates the word line WL0b, and outputs the read control signal SAEb (that is, a pulse signal having a high level), as illustrated in FIG. 2 by (i) and (j), respectively. The operation controller 10 sets the read control signal SAEb to a high level at a timing when the word line WL0b is deactivated, for example. The readout unit 20b judges the logical value of the data read onto the bit line BLX, during the high-level period of the read control signal SAEb, and generates a read data signal RDTb (having a low level) indicating the judged logical value, as illustrated in FIG. 2 by (k). Because a read data line RDTb and the bit line BLX are electrically isolated, the level of the read data signal RDTb will not be transferred to the bit line BLX. The readout unit 20b starts the precharge of the bit line BLX after the logical value of the read data signal RDTb becomes definite. By the precharge operation, the bit line BLX gradually rises up to the power supply voltage, for example, as illustrated in FIG. 2 by (l).

The operation controller 10 activates the word line WL1a in correspondence with the deactivation of the word line WL0b, as illustrated in FIG. 2 by (m). By the activation of the word line WL1a, the memory node (storing the logical value "1") on the bit line BL side of the memory unit M1a is connected to the bit line BL, and the memory node (storing the logical value "0") on the bit line BLX side of the memory unit M1a is connected to the bit line BLX. Because the memory unit M1a stores the logical value "1", the logical value "1" is read from the memory unit M1a onto the bit line BL, and the voltage of the bit line BL is maintained at the precharge voltage, as illustrated in FIG. 2 by (n).

On the other hand, because the memory node, on the bit line BLX side of the memory unit M1a which holds the logical value "1", holds the logical value "0", the voltage of the bit line BLX tends to decrease due to the activation of the word line WL1a. However, a driving force of a precharge circuit of the bit line BLX, for example, is greater than a driving force of the transfer transistor of the memory unit M1a. For this reason, even in a case where the memory node on the bit line BLX side of the memory unit M1a holds the logical value "0", the bit line BLX does not decrease from the precharge voltage, and is maintained at the precharge voltage.

Thereafter, similar to the operations described above, judging the logical value of the data read from the memory unit M1a onto the bit line BL by the readout unit 20a and the precharging the bit line BL, and the reading the data from the memory unit M1b onto the bit line BLX, are performed in parallel, as illustrated in FIG. 2 by (o). In addition, judging the logical value of the data read from the memory unit M1b onto the bit line BLX by the readout unit 20b, and the precharging the bit line BLX, are performed, as illustrated in FIG. 2 by (p).

Because the memory node, on the bit line BL side of the memory unit M1b which holds the logical value "0", holds the logical value "0", the voltage of the bit line BL tends to decrease due to the activation of the word line WL1b. However, a driving force of the precharge circuit of the bit line BL, for example, is greater than a driving force of the transfer transistor of the memory unit M1b. For this reason, even in a case where the memory node on the bit line BL side of the memory unit M1b holds the logical value "0", the bit line BL does not decrease from the precharge voltage, and is maintained at the precharge voltage.

As illustrated in FIG. 2, the semiconductor memory device 100 successively performs the read operations of the memory units Ma and Mb by mutually overlapping portions of the read operations thereof. A read cycle in which the data is read from the memory unit Ma, includes a read period (activation period of the word line WLa) in which the data is read from the memory unit Ma onto the bit line BL, and a judging period in which the readout unit 20a judges the logical value of the data read onto the bit line BL. The read cycle is equal to a clock cycle, however, the read cycle may be equal to two or more clock cycles. The read period in which the data is read from the memory unit Ma is an example of a first read period, and the judging period of the readout unit 20a is an example of a first judging period.

Similarly, a read cycle in which the data is read from the memory unit Mb, includes a read period (activation period of the word line WLb) in which the data is read from the memory unit Mb onto the bit line BLX, and a judging period in which the readout unit 20b judges the logical value of the data read onto the bit line BLX. The read period in which the data is read from the memory unit Mb is an example of a second read period, and the judging period of the readout unit 20b is an example of a second judging period. Each of the first judging period and the second judging period includes the precharge period of the bit line BL (or BLX).

For example, in each of the read cycles, the read period and the judging period are equal to each other, and respectively are one-half the read cycle. In addition, the judging period of the memory unit Ma and the read period of the memory unit Mb within the same memory cell MC mutually overlap. Further, in a case where the read operations of a plurality of memory cells MC are alternately repeated, the judging period of the memory unit Mb within one memory cell MC, and the read period of the memory unit Ma within another memory cell MC mutually overlap.

In other words, the reading of the data from the memory unit Ma (or Mb) onto the bit line BL (or BLX) due to the activation of the word line WL, and the precharging of the bit line BLX (or BL), are performed in parallel. Hence, because it is possible to mutually overlap one-half of the read cycles of the memory units Ma and Mb, for example, an apparent read cycle may be made approximately one-half the actual read cycle.

In the first embodiment illustrated in FIG. 1 and FIG. 2, the readout units 20a and 20b are connected to the bit lines BL and BLX, respectively, and the logical value of the data read from the memory units Ma and Mb are judged by mutually different readout units 20a and 20b. Hence, portions of the read cycles in which the data are read from the two memory units Ma and Mb which are respectively connected to the common bit lines BL and BLX, may mutually overlap when performed. For example, the judging period of the memory unit Ma of one memory cell MC, and the read period of the memory unit Mb of the other memory cell MC, may mutually overlap, so that the logical value of the data read onto the bit line BL can be judged during the read period in which the data is read from the memory unit Mb onto the bit line BLX. As a result, compared to a case where the read cycles do not overlap, it is possible to increase the number of data per unit time, which can be read from the semiconductor memory device 100, and improve the read access performance of the semiconductor memory device 100. For example, when reading the data held in the memory cell of the TCAM, it is possible to read from the so-called data cell and the mask cell in one read cycle, and improve the read access performance of the TCAM.

Although FIG. 1 illustrates the two memory cells MC included in the semiconductor memory device 100, a plurality of memory units Ma (or Mb) may be connected to each word line WL. In this case, a plurality of bit line pairs BL and BLX are arranged in a horizontal direction in FIG. 1, and the readout unit 20a (or 20b) is connected to each bit line BL (or BLX). In addition, a read access is simultaneously made to a plurality of memory units Ma (or Mb) which are connected to the common word line WL. Further, three or more memory cells MC may be connected to the common bit line pair BL and BLX, and in this case, the operation controller 10 controls the driving of a number of word lines WL which is two times the number of memory cells MC connected to the bit line pair BL and BLX. Accordingly, even in a case where the memory cells MC (that is, the memory units Ma and Mb) are arranged in a matrix arrangement, portions of the read cycles of the two memory units Ma and Mb connected to the common bit line pair BL and BLX can overlap when performed. As a result, compared to the case where the read cycles do not overlap, it is possible to increase the number of data per unit time, which can be read from the semiconductor memory device 100, and improve the read access performance of the semiconductor memory device 100.

Next, an example will be examined in which a common readout unit is connected to the bit line pair BL and BLX, and this readout unit reads the data held in the memory unit Ma (or Mb) according to the potential difference between the bit line pair BL and BLX. In this example, the bit line pair BL and BLX is used during both the read period and the judging period, and for this reason, portions of the read cycles of the memory units Ma and Mb cannot overlap. In addition, when performing the read operation from each of the memory units Ma and Mb within a single read cycle (as in the so-called double pump method), the read cycle becomes two times the read cycle in which the read operation is performed for each of the memory units Ma and Mb. When the read cycle is equal to the clock cycle, an operation frequency is reduced to one-half, to deteriorate the performance of the semiconductor memory device.

Furthermore, an example will be examined in which a plurality of memory cells MC are connected to a common word line pair WLa and WLb and mutually different bit line pairs BL and BLX, instead of connecting to mutually different word line pairs WLa and WLb and a common bit line pair BL and BLX. In this example, read accesses to the memory cells MC connected to the common word line pair WLa and WLb can be performed in parallel, and thus, the apparent read cycle can be reduced by successively accessing these memory cells MC. However, when the accesses to the memory cells MC connected to the common word line pair WLa and WLb cannot be performed in parallel due to a random access, for example, the read cycle cannot be reduced.

Figure 3:
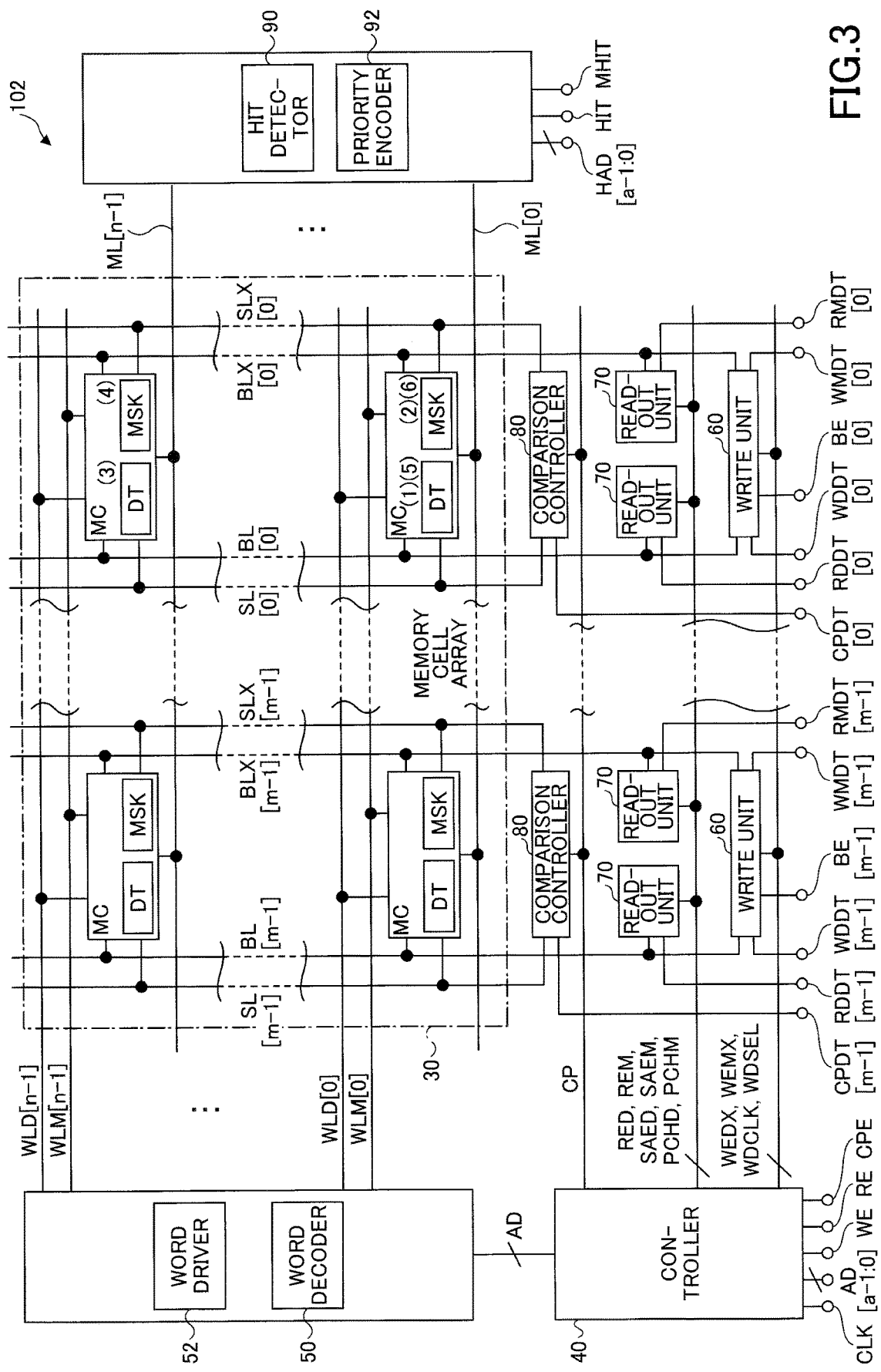
FIG. 3 is a diagram illustrating an example of the semiconductor memory device according to a second embodiment.

FIG. 3 is a diagram illustrating an example of the semiconductor memory device according to a second embodiment. A semiconductor memory device 102 illustrated in FIG. 3 includes a memory cell array 30, a controller 40, a word decoder 50, a word driver 52, a write unit 60, a readout unit 70, a comparison controller 80, a hit detector 90, and a priority encoder 92. For example, the semiconductor memory device 102 may be a TCAM, and operate in synchronism with the clock signal CLK. Each open circle "o" illustrated in FIG. 3 indicates an external terminal for exchanging signals between the semiconductor memory device 102 and another circuit. A numerical value or a symbol indicated within square brackets "[ ]" appearing immediately after a signal name, indicates a bit number of a signal line. Because the semiconductor memory device 102 operates in synchronism with the clock signal CLK, the clock signal CLK is also supplied to circuits other than the controller 40.

The memory cell array 30 includes a plurality of memory cells MC arranged in a matrix arrangement. The memory cells MC arranged in the horizontal direction FIG. 3 are connected to common word lines WLM and WLD, and a common match line ML. The memory cells MC arranged in a vertical direction FIG. 3 are connected to a common bit line pair BL and BLX and a common search line pair SL and SLX. Each memory cell MC includes a data cell DT, and a mask cell MSK. The data cell DT is connected to one of the word lines WLD, and the mask cell MSK is connected to one of the word lines WLM. The word line WLD is an example of a first word line, and the word line WLM is an example of a second word line. An example of the memory cell MC is illustrated in FIG. 4. Numerical values in brackets "( )", appearing within blocks above the names of the data cell DT and the mask cell MSK which are connected to bit lines BL[0] and BLX[0] in FIG. 3, indicate an order of access during a read operation illustrated in FIG. 9 which will described later and during a write operation illustrated in FIG. 10 which will be described later.

For example, the number "n" of word lines WLM and WLD and match lines ML is 256 or 512, and the number "m" of bit line pairs BL and BLX and search line pairs SL and SLX is 64 or 128. The values of "n" and "m" are not limited to the above values, but is desirably an exponent of 2 from a viewpoint of ease of circuit design.

The controller 40 receives the clock signal, an a-bit address signal AD[a-1:0], a write enable signal WE, a read enable signal RE, and a comparison enable signal CPE. The write enable signal WE is set to a high level when writing data to the memory cell MC. The read enable signal RE is set to a high level when reading data from the memory cell MC. The comparison enable signal CPE is set to a high level when comparing a comparison data CPDT with data stored in the memory cell MC.

The controller 40 generates a control signal for operating the memory cell array 30, and outputs the generated control signal to the word decoder 50, the word driver 52, the write unit 60, the readout unit 70, the comparison controller 80, the bit detector 90, and the priority encoder 92. The controller 40 generates a write enable signals WEDX and WEMX, a write clock signal WDCLK, and a write selection signal WDSEL, based on the write enable signal WE. The controller 40 generates read enable signals RE (RED and REM), sense amplifier enable signals SAE (SAED and SAEM), and precharge signals PCH (PCHD and PCHM), based on the write enable signal WE. The controller 40 generates a comparison signal CP to be supplied to the comparison controller 80, based on the comparison enable signal CPE.

The word decoder 50 receives the address signal AD and a timing signal from the controller 40, and selects one of the pairs of the word lines WLD and WLM connected to the common memory cell MC. In other words, the same address is assigned to the pair of the word lines WLD and WLM. The word line WLD is connected to the data cell DT, and the word line WLM is connected to the mask cell MSK. The word driver 52 successively drives the word lines WLD and WLM selected by the word decoder 50. The controller 40, the word decoder 50, and the word driver 52 are an example of an operation controller which successively selects the data cell DT and the mask cell MSK, during the read operation or the write operation.

During the write operation, the write unit 60 operates based on the write enable signal WEDX (or WEMX), the write clock signal WDCLK, and the write selection signal WDSEL output from the controller 40. The write unit 60 outputs complementary logical values corresponding to one of the write data signals WDDT and WMDT to the bit line pair BL and BLX, and writes one of the logical values of the write data signals WDDT and WMDT to the memory cell MC.

The readout unit 70 is provided for each of the bit lines BL and BLX, and includes a sense amplifier which is not illustrated in FIG. 3. Each readout unit 70 operates based on the read enable signal RED (or REM), the sense amplifier enable signal SAED (or SAEM), and the precharge signal PCHD (or PCHM) output from the controller 40. The readout unit 70 connected to the bit line BL judges the logical value of the data read from the data cell DT onto the bit line BL, based on the sense amplifier enable signal SAED, and outputs a read data signal RDDT having the judged logical value. Similarly, the readout unit 70 connected to the bit line BLX judges the logical value of the data read from the mask cell MSK onto the bit line BLX, based on the sense amplifier enable signal SAEM, and outputs a read data signal RMDT having the judged logical value. The readout unit 70 connected to the bit line BL is an example of a first readout unit, and the readout unit 70 connected to the bit line BLX is an example of a second readout unit.

The comparison controller 80 is connected to the complementary search lines SL and SLX. The comparison controller 80 performs a compare operation to judge whether the comparison data signal CPDT matches the data held in the memory cell MC, based on the comparison enable signal CP output from the controller 40. The comparison controller 80 generates complementary comparison data based on the logical value of the comparison data signal CPDT, and outputs the generated complementary comparison data to the complementary search lines SL and SLX.

The bit detector 90 detects whether data having the same logical value as the logical value of the m-bit comparison data signal CPDT is held in the memory cell array 30, for each of the word line pairs WLD and WLM, based on the logical values on the n match lines ML corresponding to the word line pairs WLD and WLM. In the following description, a data column held in m memory cells MC connected to each of the word line pairs WLD and WLM is also referred to as a word data. For example, in a case where the data indicated by the comparison data signal CPDT matches the word data, the match line ML connected to the group of memory cells MC holding this word data is set to a high level. On the other hand, in a case where the data indicated by the comparison data signal CPDT does not match the word data, the match line ML connected to the group of memory cells MC holding this word data is set to a low level. The hit detector 90 outputs a hit signal HIT when one of the match lines ML is set to the high level, and outputs a multi-hit signal MHIT when a plurality of match lines ML are set to the high level.

The priority encoder 92 detects an address assigned to the match line ML which is set to the high level, based on a detection result of the hit detector 90, and outputs the detected address as a hit address signal HAD. In a case where a plurality of match lines ML are set to the high level, the priority encoder 92 outputs, as the hit address signal HAD, a largest address, or a smallest address, among the addresses assigned to each of the match lines ML which are set to the high level.

FIG. 4 is a diagram illustrating an example of the memory cell MC illustrated in FIG. 3. Each of the data cell DT and the mask cell MSK provided in the memory cell MC includes a memory cell of the SRAM, and a judging unit JDGD or JDGM (JDG). The data cell DT is an example of a first memory unit, and the mask cell MSK is an example of a second memory unit. Of course, the data cell DT may be regarded as an example of the second memory unit, and the mask cell MSK may be regarded as an example of the first memory unit.

Each of the data cell DT and the mask cell MSK includes a pair of Complementary Metal Oxide Semiconductor (CMOS) inverters, and an output of one of the CMOS inverters is connected to an input of the other of the CMOS inverters. The CMOS inverters are operated by a power supply voltage VDD and a ground voltage VSS supplied from the semiconductor memory device 102, however, operating the CMOS inverters is not limited to such a method of operation. In each of the data cell DT and the mask cell MSK, output nodes of the pair of CMOS inverters are respectively connected to the complementary bit lines BL and BLX via the transfer transistor having the gate thereof connected to the word line WLD or WLM (WL). The logical value of the data stored in each of the data cell DT and the mask cell MSK is the logical value held by the memory node on the bit line BL side.

Each of the judging units JDGD and JDGM includes a pair of n-channel MOS transistors (hereinafter also referred to as nMOSs) connected in series between the mask line ML and the ground line VSS. In the judging unit JDGD, the gate of one of the nMOSs is connected to the search line SLX, and the gate of the other of the nMOSs is connected to the memory node on the bit line BL side of the data cell DT. In the judging unit JDGM, the gate of one of the nMOSs is connected to the search line SL, and the gate of the other of the nMOSs is connected to the memory node on the bit line BL side of the mask cell MSK. In other words, in the data cell DT, the memory node (the output of one of the CMOS inverters) connected to the bit line BL via the transfer transistor is connected to the judging unit JDGD. In the mask cell MSK, the memory node (the output of the other of the CMOS inverters) connected to the bit line BL via the transfer transistor is connected to the judging unit JDGM.

FIG. 5 is a diagram illustrating an example of a truth table for explaining an example of the operation of the semiconductor memory device 102 illustrated in FIG. 3. In FIG. 5, a symbol "H" indicates a high level or a logical value "1", and a symbol "L" indicates a low level or a logical value "0". A symbol "-" indicates a "don't care" which may be either one of the logical values "0" and "1". The symbols "(L)" and "(H)" for the bit lines BL and BLX indicate logical values which become definite by the operation of the readout unit 70. A symbol "PCH" for the bit lines BL and BLX indicates that the bit lines BL and BLX are precharged.

Further, in FIG. 5, a symbol "DT" indicates the logical value held by the data cell DT (the logical value held by the memory node on the bit line BL side), and a symbol "MSK" indicates the logical value held by the mask cell MSK (the logical value held by the memory node on the bit line BL side). An indication "No change" indicates that the logical value held by the data cell DT or the mask cell MSK does not change.

The semiconductor memory device 102 performs the write operation when the semiconductor memory device 102 receives a write command. The write command is detected when a high level of the write enable signal WE is detected in synchronism with a rising edge of the clock signal CLK.

When writing the data to the data cell DT, the word line WLD connected to the data cell DT to which the data is written is set to a high level, while the other word lines WLD and the word lines WLM are set to a low level. When writing the data to the mask cell MSK, the word line WLM connected to the mask cell MSK to which the data is written is set to a high level, while the other word lines WLM and the word lines WLD are set to a low level.

When writing the logical value "1" to the data cell DT or the mask cell MSK, the bit line BL is set to a high level, and the bit line BLX is set to a low level. When writing the logical value "0" to the data cell DT or the mask cell MSK, the bit line BL is set to a low level, and the bit line BLX is set to a high level.

The bit line pair BL and BLX corresponding to a low-level bit enable signal BE is set to a high level. Hence, among the plurality of bits of the word data, writing of the data of the bits corresponding to the low-level bit enable signal BE to the data cell DT and the mask cell MSK is masked. In other words, the semiconductor memory device 102 has a partial write function which performs a write operation only with respect to predetermined bits of the word data. During the write operation, the search lines SL and SLX are set to a low level, in order to prohibit the operation of the judging units JDGD and JDGM. Hence, the match line ML is fixed to a high level.

The semiconductor memory device 102 performs the read operation when the semiconductor memory device 102 receives a read command. The read command is detected when a high level of the read enable signal RE is detected in synchronism with the rising edge of the clock signal CLK.

When reading the data from the data cell DT, the word line WLD connected to the data cell DT from which the data is read is set to a high level, while the other word lines WLD and the word lines WLM are set to a low level. Further, the logical value of the data held in the data cell DT is read according to a voltage level of the bit line BL. When reading the data from the data cell DT, the bit line BLX is set to a precharged state. When reading the data from the mask cell MSK, the word line WLM which is connected to the mask cell MSK from which the data is read is set to a high level, while the other word lines WLM and the word lines WLD are set to a low level. The logical value of the data held in the mask cell MSK is read according to a voltage level of the bit line BLX. When reading the data from the mask cell MSK, the bit line BL is set to a precharged state. During the read operation, the search lines SL and SLX are set to a low level, in order to prohibit the operation of the judging units JDGD and JDGM. Hence, the match line ML is fixed to a high level.

The semiconductor memory device 102 performs a compare operation when the semiconductor memory device 102 receives a compare command. The compare command is detected when a high level of the comparison enable signal CPE is detected in synchronism with the rising edge of the clock signal CLK. The search line SL is set to the logical value of the comparison data CPDT illustrated in FIG. 3 which is received together with the comparison enable signal CPE, and the search line SLX is set to a logical value which is logically opposite to the logical value of the comparison data CPDT. During the compare operation, excluding exception conditions described later, when the logical value of the search line SL matches the logical value held in the data cell DT, the match line ML is maintained to a high level. In addition, when the logical value of the search line SL does not match the logical value held in the data cell DT, the match line ML changes from a high level to a low level. The judging unit JDGD or the judging unit JDGM detects the match of the logical values.

The exception conditions are described below. When the data cell DT and the mask cell MSK both hold the logical value "0", a match is detected regardless of the logical value of the source line SL, and the match line ML is maintained to the high level. In addition, when the data cell DT and the mask cell MSK both hold the logical value "1", a mismatch is detected regardless of the logical value of the source line SL, and the match line ML changes from the high level to the low level. However, writing the logical value "1" to both the data cell DT and the mask cell MSK is prohibited by operation specifications, and such a state is not used.

The match line ML is connected to a plurality of memory cells MC which hold respective bits of the word data. For this reason, when the match is judged for all data of the word data, the match line ML is maintained to the high level. On the other hand, when the mismatch is judged for at least one data of the word data, the match line ML changes to the low level. Hence, the match or mismatch to the comparison data CPDT is detected for each word data.

Figure 6:
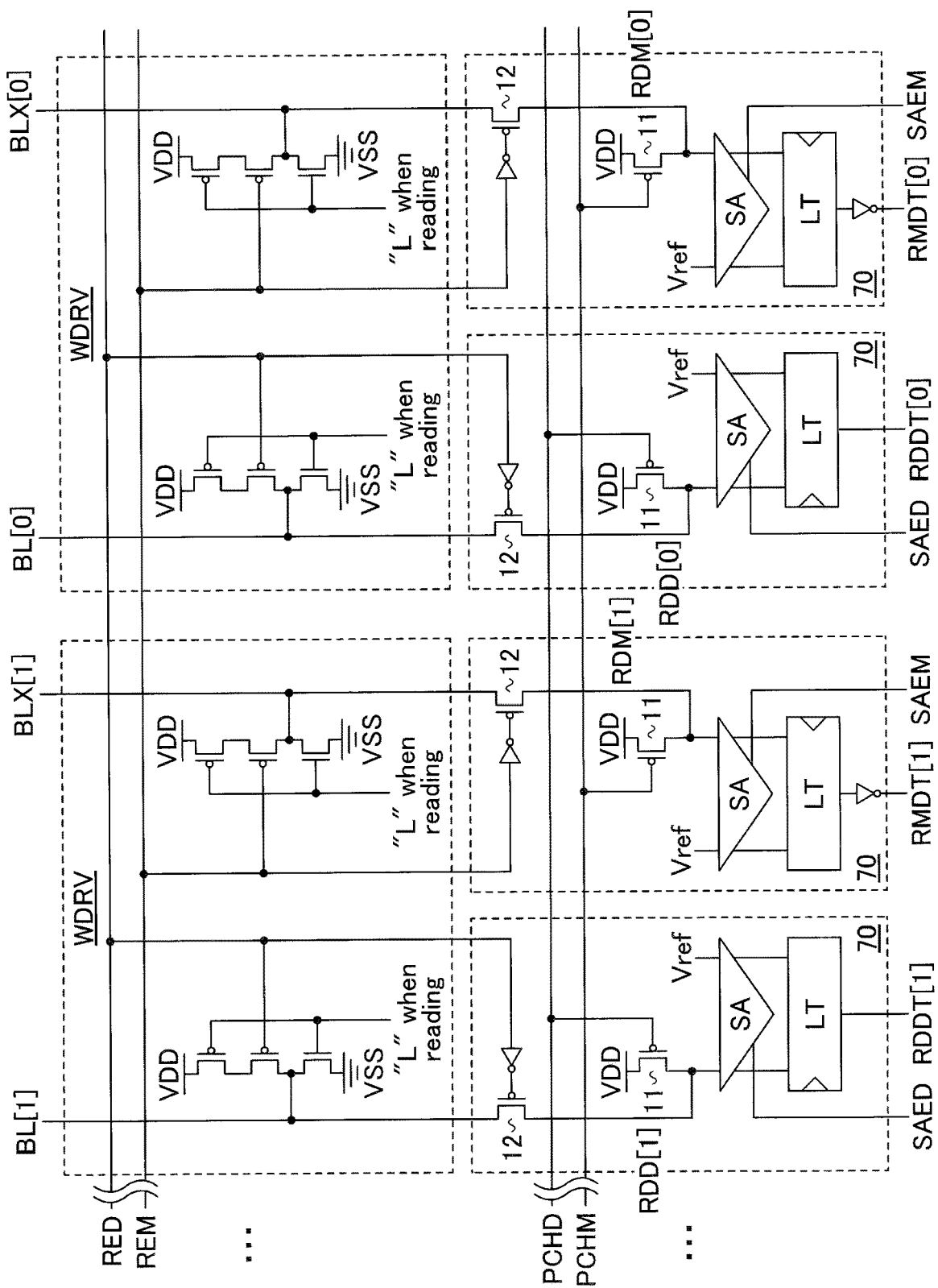
FIG. 6 is a diagram illustrating an example of a readout unit illustrated in FIG. 3.

When the write enable signal WE, the read enable signal RE, and the comparison enable signal CPE are all at the low level, the semiconductor memory device 102 changes an operation mode thereof to a standby mode. In the standby mode, the word lines WLD and WLM, the bit lines BL and BLX, and the search lines SL and SLX are all set to the low level, and the match line ML is set to the high level. FIG. 6 is a diagram illustrating an example of the readout unit 70 illustrated in FIG. 3. The readout unit 70 connected to the bit line BL, and the readout unit 70 connected to the bit line BLX, have the same configuration except that the two are connected to different signal lines. Hence, in the following, the readout unit 70 connected to the bit line BL will be described. For the description of the readout unit 70 connected to the bit line BLX, the symbols BL, RDD, SAED, RDDT, RED, PCHD, and DT in the following description shall be replaced by symbols BLX, RDM, SAEM, RMDT, REM, PCHM, and MSK.

The readout unit 70 is connected to a single bit line BL, and is a so-called single-end circuit which amplifies a signal amplitude (or voltage) of the data read onto the single bit line BL. The readout unit 70 includes a differential sense amplifier SA, and a latch LT connected to an output of the sense amplifier SA. A read data line RDD, which is connected to one of two inputs of the sense amplifier SA, connected to a p-channel MOS transistor 11 (hereinafter also referred to as a pMOS) for precharging the read data line RDD. The pMOS 11 becomes conducting during a low-level period of the precharge signal PCHD, to connect the read data line RDD to a power supply line VDD.

In addition, the read data line RDD is connected to the bit line BL via a pMOS 12 which receives a signal having a logical value which is logically inverted from that of the read enable signal RED. The pMOS 12 connected to the bit line BL is an example of a switch switch unit which cuts off a connection between the bit line BL and the sense amplifier SA during a first judging period in which the logical value of the data read from the data cell DT is judged by the sense amplifier SA. On the other hand, the pMOS 12 connected to the bit line BLX is an example of a second switch unit which cuts off a connection between the bit line BLX and the sense amplifier SA during a second judging period in which the logical value of the data read from the mask cell MSK is judged by the sense amplifier SA.

By arranging the pMOS 12 between the bit line BL and the read data line RDD, a precharge operation on the bit line BL can be started simultaneously as the start of an amplifying operation of the sense amplifier SA. A length of a judging period, including an amplifying operation period of the sense amplifier SA, is determined depending on a precharge operation period of the bit line BL. For this reason, by controlling the connection between the bit line BL and the read data line RDD by the pMOS 12, the judging period can be reduced compared to a case where no pMOS 12 is arranged.

The other of the two inputs of the sense amplifier SA is connected to a reference voltage line Vref. For example, a voltage of the reference voltage line Vref is set to an intermediate value (or center value) between the voltage read from the data cell DT holding the logical value "0" onto the bit line BL, and the power supply voltage VDD.

The sense amplifier SA operates during a high-level period of the sense amplifier enable signal SAED. The sense amplifier SA differentially amplifies a potential difference between the voltage of the read data line RDD to which the voltage of the bit line BL is transferred, and the voltage of the reference voltage line Vref. The latch LT, which is connected to the output of the sense amplifier SA, latches the data amplified by the sense amplifier SA. The latch LT outputs the latched data as the read data signal RDDT.

The precharge circuit (or precharge function) which precharges the bit lines BL and BLX is included in a write driver unit WDRV. Because the write driver unit WDRV is included in the write unit 60 illustrated in FIG. 3, the precharge circuit of the bit lines BL and BLX will be described later in conjunction with FIG. 8 which illustrates the details of the write circuit 60. In this second embodiment, a pair of readout units 70 is provided in correspondence with the bit line pair BL and BLX, and the readout units 70 of the pair of readout units 70 operate independently of each other. In addition, a pair of precharge circuits is provided in correspondence with the bit line pair BL and BLX, and the precharge circuits of the pair of precharge circuits operate independently of each other. Accordingly, as will be described later in conjunction with FIG. 9, it is possible to overlap portions of the read cycles of the data cell DT and the mask cell MSK, and the read cycle can be reduced when consecutively reading the data from the memory cell MC.

Figure 7:
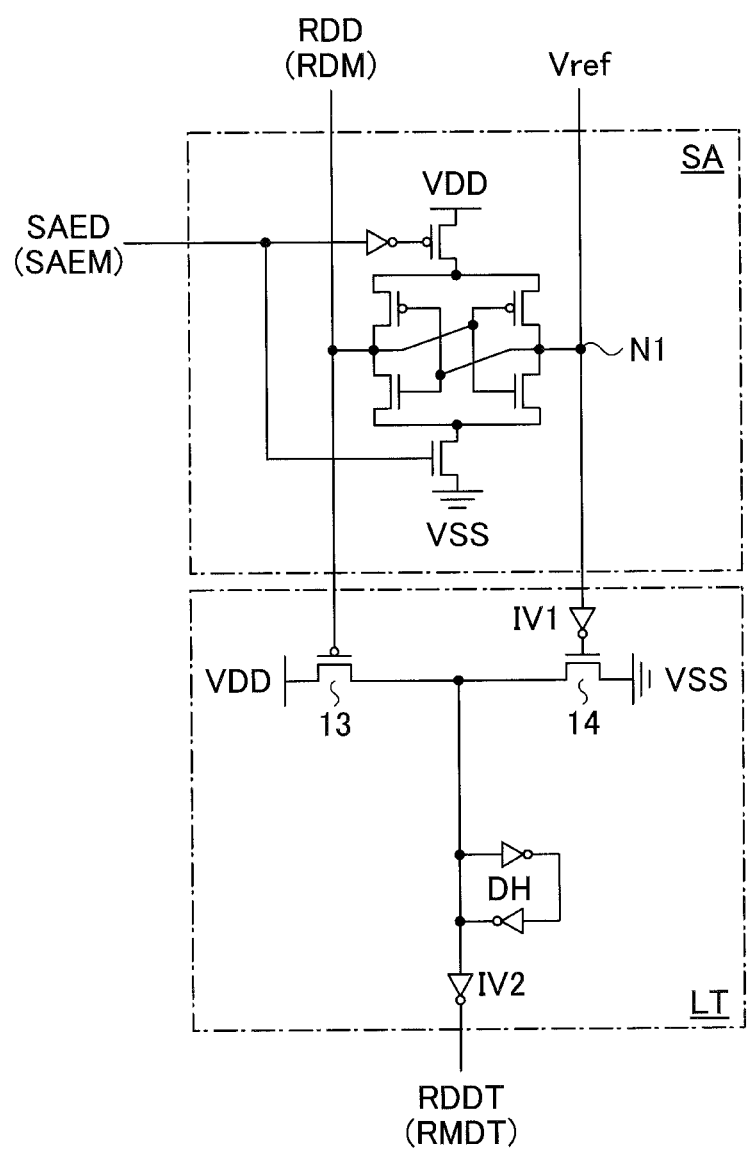
FIG. 7 is a diagram illustrating examples of a sense amplifier and a latch illustrated in FIG. 6.

FIG. 7 is a diagram illustrating examples of the sense amplifier SA and the latch LT illustrated in FIG. 6. In FIG. 7, symbols in brackets "( )" indicate names of signal lines connected to the sense amplifier SA and the latch LT corresponding to the bit line BLX (or mask cell MSK). In the following description, the sense amplifier SA and the latch LT corresponding to the bit line BL (or data cell DT) will be described.

The sense amplifier SA is a so-called latch type, and includes a pair of CMOS inverters having connections to the power supply line VDD and the ground line VSS controlled by the sense amplifier enable signal SAED. An output of one of the pair of CMOS inverters is connected to an input of the other of the pair of CMOS inverters, and the sense amplifier SA has a latch function. The latch function becomes active during a high-level period of the sense amplifier enable signal SAED. Although not illustrated in FIG. 7, one node N1 of the sense amplifier SA is connected to the reference voltage line Vref via transistors having a current driving capability lower than that of the activated sense amplifier SA. For this reason, signals obtained by amplifying the voltage of the read data line RDD and the reference voltage Vref by the sense amplifier SA are respectively output to the read data line RDD and the node N1. The sense amplifier SA detects a potential difference between the voltage of the read data line RDD and the reference voltage Vref when the sense amplifier enable signal SAED assumes a high level, and amplifies the potential difference during the high-level period of the sense amplifier enable signal SAED, to output the amplified potential difference to the read data line RDD and the node N1. The amplified complementary data signals (RDD and Vref) are supplied to the latch LT.

The latch LT includes a pMOS 13 and an nMOS 14 which are arranged in series between the power supply line VDD and the ground line VSS. A gate of the pMOS 13 is connected to the read data line RDD, and a gate of the nMOS 14 is connected to the node N1 of the sense amplifier SA via an inverter IV1. A common node connected to drains of the pMOS 13 and the nMOS 14 is connected to a data holding unit DH.

During an inactive period of the sense amplifier SA in which the sense amplifier enable signal SAED has a low level, the read data line RDD is precharged to the power supply voltage VDD or is driven solely by the memory cell MC, and the pMOS 13 is in an off state because the potential of the read data line RDD is the power supply voltage VDD or a voltage near the power supply voltage VDD. In addition, because the reference voltage Vref is also a voltage near the power supply voltage VDD, an output of the inverter IV1 has a low level, and the nMOS 14 is also in an off state. During the high-level period of the sense amplifier enable signal SAED, the sense amplifier SA is activated, and amplifies the potential difference between the voltage of the read data line RDD and the reference voltage Vref. As a result, one of the pMOS 13 and the nMOS 14 turns on.

The data holding unit DH includes a pair of inverters, and an output of one of the pair of inverters is connected to an input of the other of the pair of inverters. An output of the data holding unit DH is connected to the read data line RDDT via an inverter IV2. The latch LT imports the data amplified by the sense amplifier SA during the high-level period of the sense amplifier enable signal SAED, and latches the imported data. Of course, the sense amplifier SA and the latch LT are not limited to the circuit configurations illustrated in FIG. 7. For example, the sense amplifier SA may be a current control type including a current mirror circuit.

Figure 8:
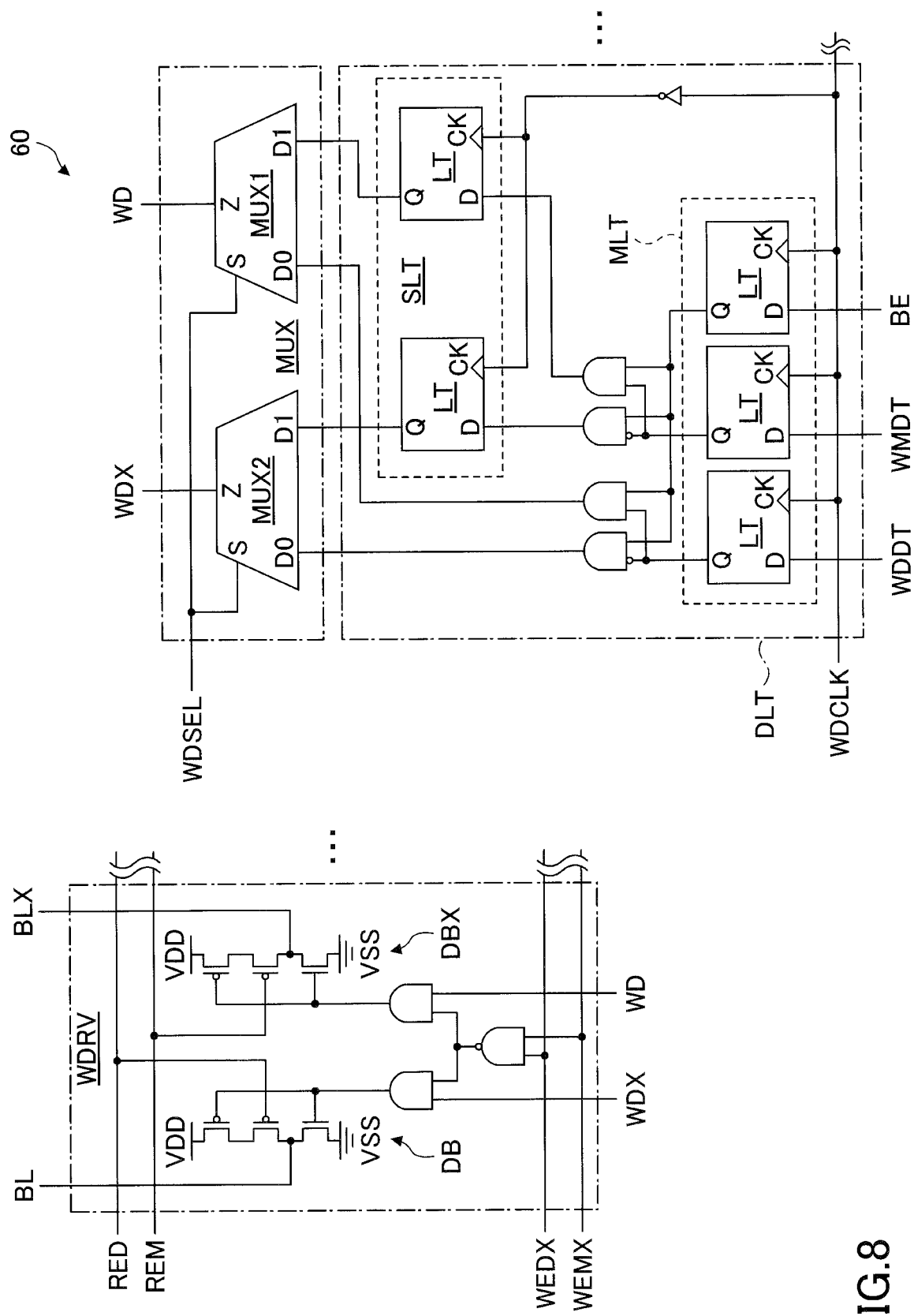
FIG. 8 is a diagram illustrating an example of a write unit illustrated in FIG. 3.

FIG. 8 is a diagram illustrating an example of the write unit 60 illustrated in FIG. 3. The write unit 60 includes a data latch unit DLT, a multiplexer unit MUX, and a write driver unit WDRV for each bit line pair BL and BLX. The multiplexer unit MUX includes multiplexers MUX1 and MUX2.

The data latch unit DLT includes a master latch unit MLT and a slave latch unit SLT. The master latch unit MLT includes three latches LT which latch the write data signals WDDT and WMDT and the bit enable signal BE, respectively, in synchronism with the write clock signal WDCLK. Each latch LT outputs the signal received at a data input terminal D from a data output terminal Q, during a low-level period of the write clock signal WDCLK, and latches the logical value of the signal received at the data input terminal D in synchronism with a rising edge of the write clock signal WDCLK. In the master latch unit MLT, the latch LT which latches the write data signal WDDT is an example of a first holding unit which holds the write data to be written to the data cell DT.

In a case where the write data signal WDDT is supplied to the master latch unit MLT together with a high-level bit enable signal BE, the logical value of the write data signal WDDT and an inverted logical value thereof are supplied from the master latch unit MLT to the multiplexers MUX1 and MUX2, respectively. In a case where the write data signal WDDT is supplied to the master latch unit MLT together with a low-level bit enable signal BE, the logical value of the write data signal WDDT and a low level in place of the inverted logical value thereof are supplied from the master latch unit MLT to the multiplexers MUX1 and MUX2, respectively. In addition, in a case where the write data signal WMDT is supplied to the master latch unit MLT together with the high-level bit enable signal BE, the logical value of the write data signal WMDT and the inverted logical value thereof are supplied from the master latch unit MLT to the slave latch unit SLT. In a case where the write data signal WMDT is supplied to the master latch unit MLT together with the low-level bit enable signal BE, the logical value of the write data signal WMDT and a low level in place of the inverted logical value thereof are supplied from the master latch unit MLT to the slave latch unit SLT.

The slave latch unit SLT includes two latches LT which latch the logical value of the write data signal WMDT and the inverted logical value thereof, respectively output from the master latch unit MLT. The latches LT of the slave latch unit SLT transfer the logical value of the write data signal WMDT and the inverted logical value thereof, supplied from the master latch unit MLT, to the multiplexers MUX1 and MUX2 during a high-level period of the write clock signal WDCLK. Further, the latches LT of the slave latch unit SLT latch the logical value of the write data signal WMDT and the inverted logical value thereof, in synchronism with a falling edge of the write clock signal WDCLK. The latches LT included in the slave latch unit SLT are an example of a second holding unit which holds the data to be written to the mask cell MSK. By providing the master latch unit MLT and the slave latch unit SLT, the write data signals WDDT and WMDT, which are supplied in parallel to the semiconductor memory device 102, can be successively supplied to the write driver unit WDRV, and it is possible to successively perform the write operation.

The multiplexer MUX1 selects the write data signal WDDT from the master latch unit MLT when the write selection signal WDSEL has a low level. The multiplexer MUX1 selects the write data signal WMDT from the slave latch unit SLT when the write selection signal WDSEL has a high level. The multiplexer MUX1 outputs the selected signal as the write data signal WD.

The multiplexer MUX2 selects a signal having an inverted logical value of the write data signal WDDT from the master latch unit MLT when the write selection signal WDSEL has the low level. The multiplexer MUX2 selects a signal having an inverted logical value of the write data signal WMDT from the slave latch unit SLT when the write selection signal WDSEL has the high level. The multiplexer MUX2 outputs the selected signal as the write data signal WDX.

The multiplexers MUX1 and MUX2 respectively include two CMOS transmission gates having input nodes connected to data input terminals D0 and D1, and an output node connected to a data output terminal Z. The two CMOS transmission gates exclusively conduct according to the logical value of the write selection signal WDSEL, to select the signal supplied to one of the data input terminals D0 and D1. However, the configuration of the multiplexers MUX1 and MUX2 is not limited to such a configuration.

The multiplexer unit MUX is an example of a selector which selects the write data signal WMDT held in the slave latch unit SLT, after selecting the write data signal WDDT held in the master latch unit MLT, during the write operation of the memory cell MC. By selecting the outputs of the master latch unit MLT and the slave latch unit SLT by the multiplexer MUX, the data can be written to the data cell DT or the mask cell MSK using a common write driver unit WDRV.

Two AND gates which generate the signals supplied to the data input terminals D of the slave latch unit SLT may be connected to the data output terminals Q of the two latches LT of the slave latch unit SLT. In this case, the data output terminal Q of the latch LT which latches the write data signal WMDT in the master latch unit MLT may be directly connected to the data input terminal D of the left latch LT of the slave latch unit SLT illustrated in FIG. 8. The AND gate having an inverting input terminal may be arranged between the data input terminal D1 of the multiplexer MUX2 and the data output terminal Q of the left latch LT of the slave latch unit SLT illustrated in FIG. 8. The AND gate not having the inverting input terminal may be arranged between the data input terminal D1 of the multiplexer MUX1 and the data output terminal of the left latch LT of the slave latch unit SLT illustrated in FIG. 8.

Further, the right latch LT of the slave latch unit SLT illustrated in FIG. 8 may latch the bit enable signal BE output from the master latch unit MLT in synchronism with a falling edge of the clock signal CLK. The data output terminal Q of the latch LT which latches the bit enable signal BE may be connected to the inputs of the two AND gates which are moved.

The write driver unit WDRV includes a data buffer DB which outputs data to the bit line BL, and a data buffer DBX which outputs data to the bit line BLX. The write driver unit WDRV operates the data buffers DB and DBX during a low-level period of the write enable signal WEDX, and drives the bit lines BL and BLX according to the logical values of the write data signals WD and WDX (that is, WDDT). In addition, the write driver unit WDRV operates the data buffers DB and DBX during a low level period of the write enable signal WEMX, and drives the bit lines BL and BLX according to the logical values of the write data signals WD and WDX (that is, WMDT). Hence, the logical value of the write data signal WDDT is written to the data cell DT, and the logical value of the write data signal WMDT is written to the mask cell MSK. The write driver unit WDRV is an example of a data write unit, which successively writes the write data signals WDDT and WMDT successively selected by the multiplexer unit MUX to the data cell DT and the mask cell MSK via the bit line pair BL and BLX.

During a write cycle in which the data is written to the data cell DT or the mask cell MSK, the read enable signals RED and REM are set to the low level, and thus, the data buffers DB and DBX operate as CMOS inverters. In addition, during a read cycle in which the data is read from the data cell DT or the mask cell MSK, the write enable signals WEDX and WEMX are fixed to the high level. For this reason, control signals for the data buffers DB and DBX, generated based on the write enable signals WEDX and WEMX and the write data signals WD and WDX, are set to a low level.

Accordingly, the data buffer DB functions as a precharge circuit which precharges the bit line BL during the low-level period of the read enable signal RED. The data buffer DBX functions as a precharge circuit which precharges the bit line BLX during the low-level period of the read enable signal REM. Hence, the precharge circuits respectively connected to the bit lines BL and BLX operate independently in response to mutually different read enable signals RED and REM. For this reason, as will be described in conjunction with FIG. 9, during the read operation, it is possible to mutually overlap portions of the read cycles of the data cell DT and the mask cell MSK connected to the common bit line pair BL and BLX. The data buffer DB is an example of a first initializing unit which initializes the voltage of the bit line BL to the precharge voltage. The data buffer DBX is an example of a second initializing unit which initializes the voltage of the bit line BLX to the precharge voltage.

Figure 9:
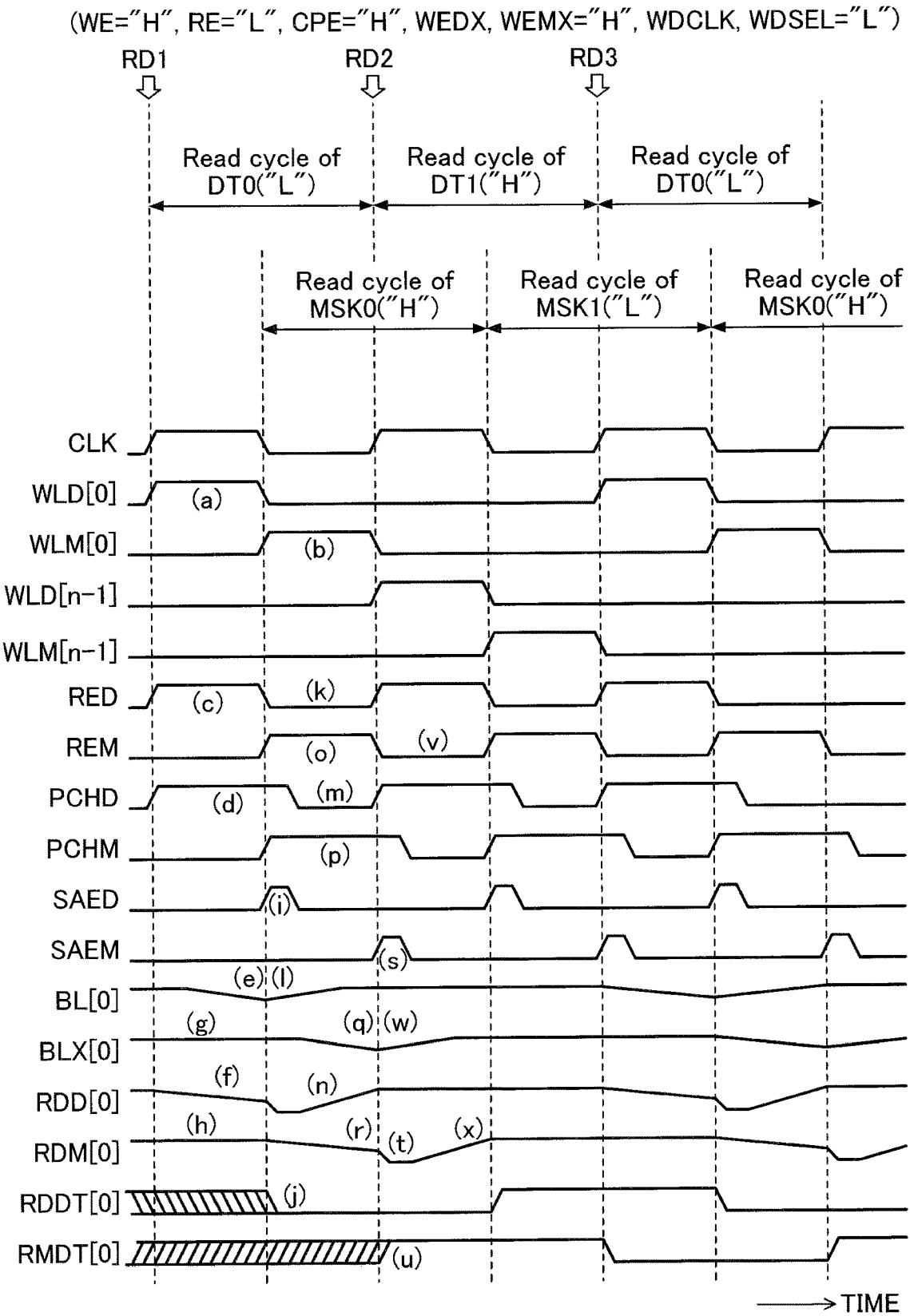
FIG. 9 is a diagram for explaining an example of a read operation of the semiconductor memory device illustrated in FIG. 3.

FIG. 9 is a diagram for explaining an example of a read operation of the semiconductor memory device 102 illustrated in FIG. 3. In order to avoid the figure from becoming too complicated, FIG. 9 illustrates transition edges of main signals as being aligned to transition edges of the clock signal CLK, for the sake of convenience. However, in actual operation, a predetermined setup time and a predetermined hold time are set with respect to the clock signal CLK and other control signals. In addition, changes in the voltages of the bit lines BL and BLX and the read data lines RDD and RDM are exaggerated in FIG. 9, in order to facilitate the understanding of the read operation.

When describing FIG. 9, the memory cell MC connected to the word lines WLD[0] and WLM[0] and the bit line pair BL[0] and BLX[0] is referred to as a memory cell MC0. The memory cell MC connected to the word lines WLD[n−1] and WLM[n−1] and the bit line pair BL[0] and BLX[0] is referred to as a memory cell MC1. In addition, the data cell DT and the mask cell MSK of the memory cell MC0 are referred to as a data cell DT0 and a mask cell MSK0, respectively. The data cell DT and the mask cell MSK of the memory cell MC1 are referred to as a data cell DT1 and a mask cell MSK1, respectively. In the example illustrated in FIG. 9, the data cell DT0 holds "L", the mask cell MSK0 holds "H", the data cell DT1 holds "H", and the mask cell MSK1 holds "L".

In FIG. 9, the data cell DT and the mask cell MSK are successively accessed in the order of the numerals in brackets "( )" illustrated in FIG. 3.

The read operation is performed based on each read command RD (RD1, RD2, and RD3). The read command RD (RE="L") is supplied to the semiconductor memory device 102 in synchronism with the rising edge of the clock signal CLK. Further, the data are successively read from both the data cell DT and the mask cell MSK for every read command RD. In the example illustrated in FIG. 9, the reading of the data from the memory cell MC0 connected to the word lines WLD[0] and WLM[0], and the reading of the data from the memory cell MC1 connected to the word lines WLD[n−1] and WLM[n−1] are successively performed. Similar to the example illustrated in FIG. 2, the read cycle is equal to one clock cycle, and the read cycle in which the data is read from the data cell DT, and the read cycle in which the data is read from the mask cell MSK, overlap for one-half cycle of the clock signal CLK (that is, one-half the clock cycle). Circuits which operate to read the data from each of the memory cells MC0 and MC1 will be described in the following.

The controller 40 controls the word driver 52, to activate the word line WLD[0] during a first half of the clock cycle in which the read command RD1 is received, and activate the word line WLM[0] during a second half of the clock cycle in which the read command RD1 is received, as illustrated in FIG. 9 by (a) and (b), respectively. For example, the first half of the clock cycle is the high-level period of the clock signal CLK, and the second half of the clock cycle is the low-level period of the clock signal CLK.

In addition, the controller 40 sets the read enable signal RED and the precharge signal PCHD to a high level during the first half of the clock cycle in which the read command RD1 is received, as illustrated in FIG. 9 by (c) and (d), respectively. The write driver unit WDRV, which receives the high-level read enable signal RED, stops precharging the bit line BL[0]. The readout unit 70, which receives the high-level precharge signal PCHD, stops precharging the read data line RDD[0] connected to the input of the sense amplifier SA.

The data cell DT0 is connected to the bit line BL[0] due to the activation of the word line WLD[0]. In addition, due to the logical value "0" read from the data cell DT0, the voltage of the bit line BL[0] gradually decreases from the precharge voltage, as illustrated in FIG. 9 by (e). The high-level period of the clock signal CLK during the clock cycle in which the read command RD is received, is an example of a first read period in which the data is read from the data cell DT onto the bit line BL. During the high-level period of the read enable signal RED, the pMOS 12 of the readout unit 70 conducts, and the read data line RDD[0] is connected to the bit line BL[0]. For this reason, the voltage of the bit line BL[0] is transferred to the read data line RDD[0], and the voltage of the read data line RDD[0] decreases, as illustrated in FIG. 9 by (f).

The bit line BLX[0] is maintained to the precharge voltage by the low-level read enable signal REM, as illustrated in FIG. 9 by (g). For example, the ability to precharge the bit line BLX[0] is higher than the ability of the data cell DT0 holding "H" to decrease the voltage of the bit line BLX[0] during the precharging thereof. Hence, the bit line BLX[0] is maintained to the precharge voltage, even when the data cell DT0 holds "H", and "L" is read from the data cell DT0 onto the bit line BLX[0] by the read operation. In other words, the voltage of the bit line BLX[0] is maintained to the precharge voltage regardless of the logical value held in the data cell DT0. The read data line RDM[0] is maintained to a precharged state by the low-level precharge signal PCHM, as illustrated in FIG. 9 by (h).

Next, the controller 40 sets the sense amplifier enable signal SAED to a high level for a predetermined period in synchronism with the falling edge of the clock signal CLK during the clock cycle in which the read command RD1 is received, as illustrated in FIG. 9 by (i). Hence, the sense amplifier SA amplifies the voltage of the read data line RDD[0]. The logical value obtained by the amplification is output from the latch LT as the read data signal RDDT[0], as illustrated in FIG. 9 by (j). In other words, the logical value "0" held in the data cell DT0 is read. The low-level period of the clock signal CLK during the clock cycle in which the read command RD is received, is an example of a first judging period in which the logical value of the data read from the data cell DT onto the bit line BL is judged.

The controller 40 sets the read enable signal RED to the low level, after starting the operation of the sense amplifier SA, as illustrated in FIG. 9 by (k). The connection between the bit line BL[0] and the read data line RDD[0] is cut off by the low-level read enable signal RED. In addition, the data buffer DB of the write driver unit WDRV precharges the bit line BL by the low-level read enable signal RED. When precharging the bit line BL, the connection between the bit line BL and the read data line RDD is cut off by the pMOS 12 of the readout unit 70, and thus, it is possible to prevent the precharging of the bit line BL from affecting the read data line RDD. Accordingly, it is possible to prevent the sense amplifier SA from performing an erroneous operation by being affected by the precharge voltage of the bit line BL.

The bit line BL[0] is precharged and gradually changes to the power supply voltage VDD, as illustrated in FIG. 9 by (l). A voltage decrease of the bit line BL when reading the logical value "0" from the data cell DT is smaller than a threshold voltage of the transfer transistor of the data cell DT, for example. For this reason, even when the word line WLM[0] is activated before the bit line BL is precharged, the voltage of the bit line BL will not be transferred to the mask cell MSK, and the data stored in the mask cell MSK will not be destroyed.

The controller 40 sets the precharge signal PCHD to the low level, based on the deactivation of the sense amplifier enable signal SAED to the low level, as illustrated in FIG. 9 by (m). The read data line RDD[0] is precharged by the low-level precharge signal PCHD, and gradually changes to the power supply voltage VDD, as illustrated in FIG. 9 by (n). Hence, the read operation of the data from the data cell DT is completed during the clock cycle in which the read command RD1 is received.

On the other hand, the controller 40 sets the read enable signal REM and the precharge signal PCHM to the high level during the second half of the clock cycle in which the read command RD1 is received, as illustrated in FIG. 9 by (o) and (p), respectively. The precharging of the bit line BLX[0] is stopped by the high-level read enable signal REM, and the precharging of the read data line RDM[0] is stopped by the high-level precharge signal PCHM.

The data is read from the mask cell MSK[0] onto the bit line BLX[0] by the activation of the word line WLM[0], and the voltage of the bit line BLX[0] gradually decreases from the precharge voltage, as illustrated in FIG. 9 by (q). The low-level period of the clock signal CLK during the clock cycle in which the read command RD is received, is an example of a second read period in which the data is read from the mask cell MSK onto the bit line BLX. During the high-level period of the read enable signal REM, the bit line BLX[0] is connected to the read data line RDM[0], and the voltage of the read data line RDM[0] decreases by following the voltage of the bit line BLX[0], as illustrated in FIG. 9 by (r).

Next, the controller 40 sets the sense amplifier enable signal SAEM to a high level for a predetermined period in synchronism with the rising edge of the clock signal CLK during a next clock cycle which is next to the clock cycle in which the read command RD1 is received, as illustrated in FIG. 9 by (s). Hence, the sense amplifier SA amplifies the voltage of the read data line RDM[0], as illustrated in FIG. 9 by (t). The latch LT of the readout unit 70 latches the logical value of the read data line RDM[0] amplified by the sense amplifier SA, and outputs the latched logical value as the read data signal RMDT[0], as illustrated in FIG. 9 by (u). In other words, the logical value "0" held in the data cell DT0 is read.

Accordingly, the data can be read from both the data cell DT and the mask cell MSK based on a single read command RD. The high-level period of the clock signal CLK during the next clock cycle which is next to the clock cycle in which the read command RD is received, is an example of a second judging period in which the logical value of the data read from the mask cell MSK onto the bit line BLX is judged.

The controller 40 sets the read enable signal REM to the low level after starting the operation of the sense amplifier SA, and cuts off the connection between the bit line BLX[0] and the read data line RDM[0], as illustrated in FIG. 9 by (v). In addition, the bit line BLX[0] is precharged by the low-level read enable signal REM, and the bit line BLX[0] gradually changes to the power supply voltage VDD, as illustrated in FIG. 9 by (w).

The data buffer DBX of the write driver unit WDRV precharges the bit line BLX by the low-level read enable signal REM. When precharging the bit line BLX, the connection between the bit line BLX and the read data line RDM is cut off by the pMOS 12 of the readout unit 70, and thus, it is possible to prevent the precharging of the bit line BLX from affecting the read data line RDM. Accordingly, it is possible to prevent the sense amplifier SA from performing an erroneous operation by being affected by the precharge voltage of the bit line BLX.

The controller 40 sets the precharge signal PCHM to a low level, and precharges the read data line RDM[0], based on the deactivation of the sense amplifier enable signal SAEM to the low level, as illustrated in FIG. 9 by (x). Hence, the read operation of the data from the mask cell MSK is completed in one clock cycle from the falling edge of the clock signal CLK during the clock cycle in which the read command RD1 is received.

Thereafter, the controller 40 successively receives the read commands RD2 and RD3 in synchronism with the rising edge of the clock signal CLK, and performs the read operation similar to the read operation in response to the read command RD1. As a result, when a plurality of read commands RD are consecutively supplied to the semiconductor memory device 102, it is possible to alternately perform the read operation of the data cell DT and the read operation of the mask cell MSK by successively shifting the read operation of the data cell DT and the read operation of the mask cell MSK by one-half clock cycle.

According to this second embodiment, both the read period and the judging period can be set independently for each of the bit lines BL and BLX, by providing the readout unit 70 for each of the bit lines BL and BLX. Hence, during the read operation, it is possible to mutually overlap portions of the read cycles in which the data are read from the data cell DT and the mask cell MSK which are connected to the common bit line pair BL and BLX.

In other words, during the read period in which the data is read from the mask cell MSK onto the bit line BLX, it is possible to precharge the bit line BL onto which the data is read from the data cell DT. Similarly, during the read period in which the data is read from the data cell DT onto the bit line BL, it is possible to precharge the bit line BLX onto which the data is read from the mask cell MSK. Consequently, it is possible to conceal the precharge periods of the bit lines BL and BLX, and the apparent read cycle can be reduced to approximately one-half the actual read cycle during the read operations of each of the data cell DT and the mask cell MSK.

In addition, by initializing the voltage of the bit line BL (or BLX), to which the logical value to be judged by the sense amplifier SA is transferred, to the precharge voltage or the like based on the start of the judging period, it is possible to prepare for the next read period during the judging period. For this reason, compared to a case where an initializing period is provided between the judging period and the read period, it is possible to reduce the read cycle.

Figure 10:
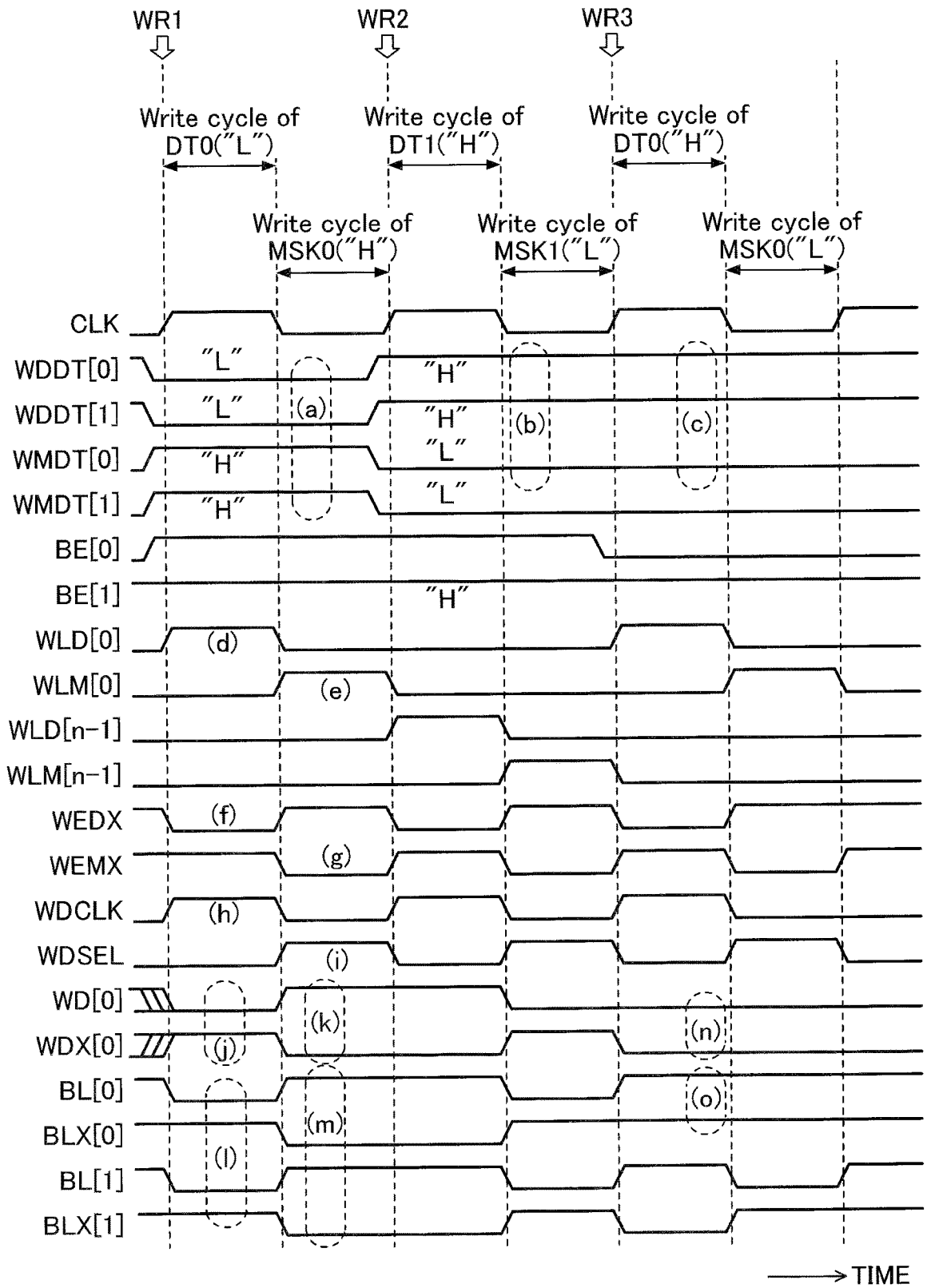
FIG. 10 is a diagram for explaining an example of a write operation of the semiconductor memory device illustrated in FIG. 3.

FIG. 10 is a diagram for explaining an example of a write operation of the semiconductor memory device 102 illustrated in FIG. 3. In order to avoid the figure from becoming too complicated, FIG. 10, similar to FIG. 9, illustrates transition edges of main signals as being aligned to transition edges of the clock signal CLK, for the sake of convenience. In addition, the data cell DT and the mask cell MSK connected to the word lines WLD[0] and WLM[0] and the bit line pair BL[0] and BLX[0] are referred to as a data cell DT0 and a mask cell MSK0, respectively. The data cell DT and the mask cell MSK connected to the word lines WLD[n−1] and WLM[n−1] and the bit line pair BL[0] and BLX[0] are referred to as a data cell DT1 and a mask cell MSK1, respectively.

In FIG. 10, the data cell DT and the mask cell MSK are successively accessed in the order of the numerals in brackets "( )" illustrated in FIG. 3. First, a logical value "0" and a logical value "1" are successively written to the data cell DT0 and the mask cell MSK0, respectively. Next, a logical value "1" and a logical value "0" are successively written to the data cell DT1 and the mask cell MSK1, respectively. Further, a logical value "1" and a logical value "0" are successively written to the data cell DT0 and the mask cell MSK0, respectively. During the third clock cycle, the bit enable signal BE[0] is set to a low level, and thus, no data is written to the data cell DT and the mask cell MSK which are connected to the bit line pair BL[0] and BLX[0]. In other words, a partial write is performed in which the data is written to a portion of the plurality of memory cells MC connected to the plurality of bit line pairs BL and BLX.

The write unit 60 illustrated in FIG. 8 receives write data signals WDDT and WMDT in parallel, in synchronism with each write command WR (WR1, WR2, and WR3), as illustrated in FIG. 10 by (a), (b), and (c), respectively. Hence, the semiconductor memory device 102 includes data terminals for receiving the write data signals WDDT and WMDT independently of each other. Of course, the semiconductor memory device 102 may include a common data terminal for receiving the write data signals WDDT and WMDT. In this case, the semiconductor memory device 102 may receive the write data signal WDDT in synchronism with the rising edge of the clock signal CLK, and receive the write data signal WMDT in synchronism with the falling edge of the clock signal CLK. Further, the slave latch unit SLT and the multiplexer unit MUX illustrated in FIG. 8 become unnecessary, and the circuit scale of the write unit 60 can be reduced. Moreover, in the case where the write data signals WDDT and WMDT are supplied via the common data terminal, the order in which the write data signals WDDT and WMDT is supplied may be changed.

Next, the write operation with respect to the write command WR1 will be described. The controller 40 illustrated in FIG. 3 outputs to the word decoder 50 the write command WR1 together with the received address signal AD (not illustrated). The word decoder 50 decodes the address signal AD, and outputs a decoded result to the word driver 52. The word driver 52 successively drives the word lines WLD[0] and WLM[0] indicated by the decoded result, as illustrated in FIG. 10 by (d) and (e), respectively.

In addition, the controller 40 sets the write enable signal WEDX to a low level during the high-level period of the clock signal CLK in which the write command WR1 is received, as illustrated in FIG. 10 by (f). The controller 40 sets the write enable signal WEMX to a low level during the low-level period of the clock signal CLK in which the write command WR1 is received, as illustrated in FIG. 10 by (g). The controller 40 sets the clock signal WDCLK to a high level during the high-level period of the clock signal CLK in which the write command WR1 is received, as illustrated in FIG. 10 by (h). Further, the controller 40 sets the write selection signal WDSEL to a high level during the low-level period of the clock signal CLK in which the write command WR1 is received, as illustrated in FIG. 10 by (i).

The master latch unit MLT illustrated in FIG. 8 latches the logical values of the write data signals WDDT and WMDT and the bit enable signal BE, in synchronism with the rising edge of the write clock signal WDCLK. When the high-level bit enable signal BE is latched, the logical value of the latched write data signal WDDT and the inverted logical value thereof are output to the multiplexers MUX1 and MUX2, respectively. In addition, when the high-level bit enable signal BE is latched, the logical value of the latched write data signal WMDT and the inverted logical value thereof are supplied to the slave latch unit SLT.

The multiplexers MUX1 and MUX2 output the logical value of the write data signal WDDT and the inverted logical value thereof to the write driver unit WDRV, as the write data signals WD and WDX, respectively based on the low-level write selection signal WDSEL, as illustrated in FIG. 10 by (j).

When the high-level bit enable signal BE is latched by the master latch unit MLT, the slave latch unit SLT outputs the logical value of the write data signal WMDT and the inverted logical value thereof to the multiplexers MUX1 and MUX2, respectively. In addition, the slave latch unit SLT latches the logical value of the write data signal WMDT and the inverted logical value thereof, in synchronism with the falling edge of the write clock signal WDCLK.

The multiplexers MUX1 and MUX2 output the logical value of the write data signal WMDT and the inverted logical value thereof to the write driver unit WDRV, as the write data signals WD and WDX, respectively, based on the high-level write selection signal WDSEL, as illustrated in FIG. 10 by (k). The write driver unit WDRV drives the bit lines BL and BLX according to the logical values of the write data signals WD and WDX, when either one of the write enable signals WEDX and WEMX has a low level. For example, the write driver unit WDRV outputs the logical value of the write data signal WD to the bit line BL, and outputs the logical value of the write data signal WDX to the bit line BLX.

Accordingly, during the clock cycle in which the write command WR1 is received, the logical value of the write data signal WDDT is written to the data cell DT during the high-level period of the clock signal CLK, as illustrated in FIG. 10 by (l). In addition, the logical value of the write data signal WMDT is written to the mask cell MSK during the low-level period of the clock signal CLK, as illustrated in FIG. 10 by (m). In other words, the semiconductor memory device 102 can write the data to both the data cell DT and the mask cell MSK in one clock cycle. Hence, an external controller of a CPU core or the like, which is externally connected to the semiconductor memory device 102, can improve the data write rate, compared to a case where the write command WR is generated for every clock cycle and the write data signals WDDT and WMDT are successively written. Further, the external controller can reduce the frequency of generating the write command WR, and a simple control of the semiconductor memory device 102 can be achieved, compared to a case where the write command WR is generated for every data write to the data cell DT and the mask cell MSK.

The write driver unit WDRV outputs the write data signal WDDT to the bit line pair BL and BLX in accordance with the start of driving the word line WLD[0]. In addition, the write driver unit WDRV outputs the write data signal WMDT to the bit line pair BL and BLX in accordance with the start of driving the word line WLM[0]. For this reason, when writing the logical value "1" to the data cell DT, for example, the voltage of the bit line BL can be set from the low level to a flip-point voltage or greater before the word line WLD[0] is activated to the high level. The flip-point voltage refers to the voltage of the bit line BL when the logical value "1" held in the data cell DT is inverted to the logical value "0", as the voltage of the bit line BL is reduced from the high level in the activated state of the word line WLD, for example. Alternatively, the flip-point voltage refers to the voltage of the bit line BLX when the logical value "0" held in the data cell DT is inverted to the logical value "1", as the voltage of the bit line BLX is reduced from the high level in the activated state of the word line WLD, for example. The flip-point voltage may be approximately one-half of the power supply voltage VDD, for example.

According to this second embodiment, the voltage of the bit line BL or BLX can be set to the flip-point voltage or greater before the word line WLD is activated, by outputting the write data signal WDDT to the bit line pair BL and BLX in accordance with the start of driving the word line WLD. Similarly, the voltage of the bit line BL or BLX can be set to the flip-point voltage or greater before the word line WLM is activated, by outputting the write data signal WMDT to the bit line pair BL and BLX in accordance with the start of driving the word line WLM. As a result, it is possible to prevent an erroneous logical value from being written to the data cell DT or the mask cell MSK.

The write operation based on the write command WR2 is the same as the write operation based on the write command WR1, except for the inverted logical value of the data. The write operation based on the write command WR3 is the same as the write operation based on the write command WR1, except for masking of the data write to the data cell DT and the mask cell MSK by the low-level bit enable signal BE[0]. In other words, in the write operation based on the write command WR3, the write data signals WD and WDX are both set to the low level, and the bit line pair BL[0] and BLX[0] is set to the high level, as illustrated in FIG. 10 by (n) and (o), respectively. When the bit line pair BL[0] and BLX[0] is set to the high level, the data write is masked because the logical value of the memory node holding the logical value "1", among the complementary memory nodes of the data cell DT or the mask cell MSK, will not be inverted.

In the semiconductor memory device 102 illustrated in FIG. 3, the next data write is performed, without precharging the bit lines BL and BLX after the data write, as illustrated in FIG. 10. Hence, compared to the case where the precharge operation is performed, it is possible to reduce the write cycle, and to complete the data write operation to the data cell DT and the mask cell MSK in one clock cycle based on the write command WR.

Figure 11:
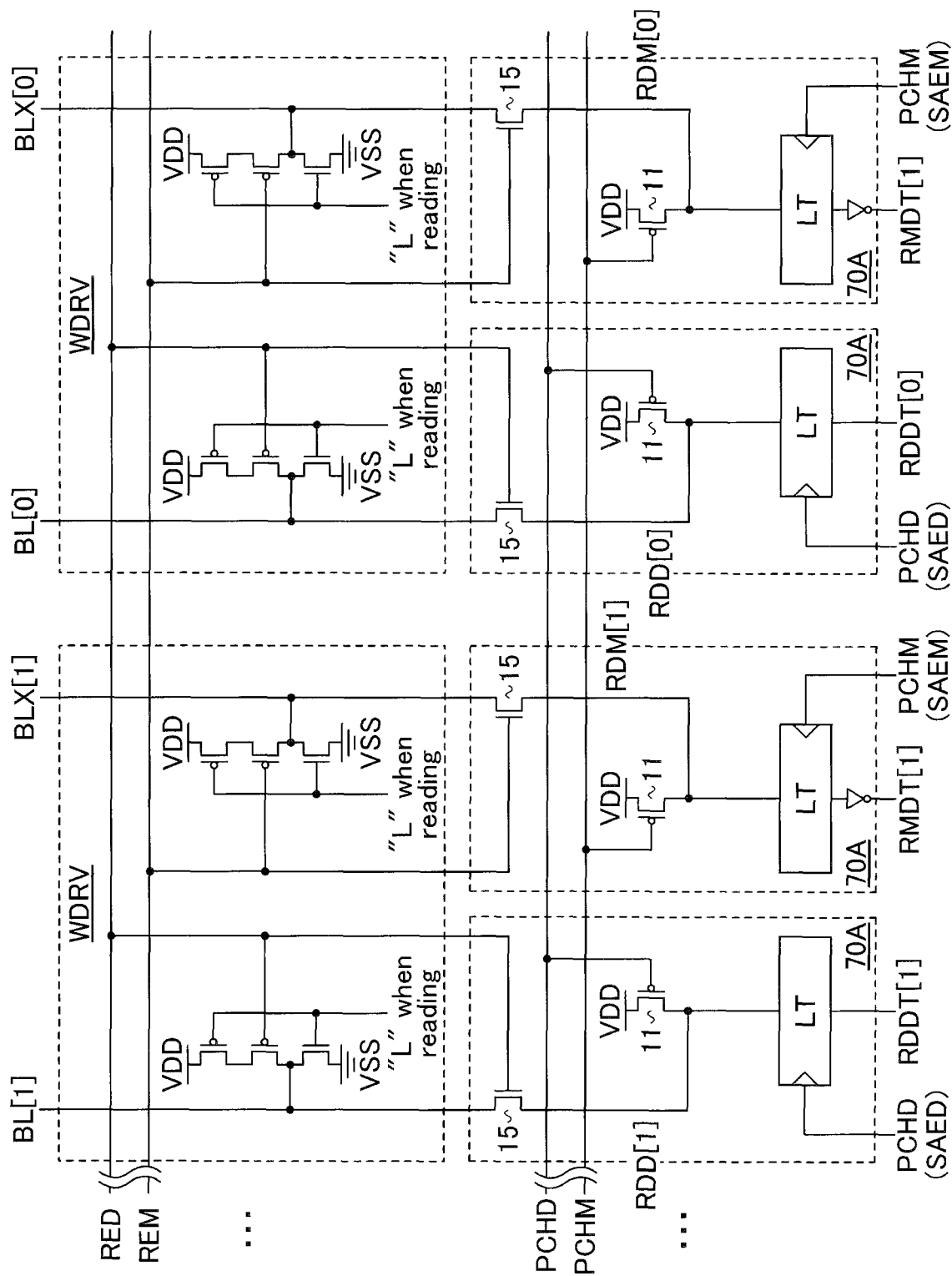
FIG. 11 is a diagram illustrating another example of the readout unit illustrated in FIG. 3.

FIG. 11 is a diagram illustrating another example of the readout unit illustrated in FIG. 3. In FIG. 11, the semiconductor memory device 102 includes readout units 70A in place of the readout units 70 illustrated in FIG. 6. In the readout unit 70A, the sense amplifier SA of the readout unit 70 is omitted, and an nMOS 15 having a gate which receives the read enable signal RED (or REM), is arranged in place of the pMOS 12. Further, the latch LT operates in synchronism with the precharge signal PCHD (or PCHM). Similar to FIG. 6, the latch LT may operate in synchronism with the sense amplifier enable signal SAED (or SAEM).

The nMOS 15 connects the bit line BL (or BLX) to the read data line RDD (or RDM) during the high-level period of the read enable signal RED (or REM). By using the nMOS 15, the low level of the bit line BL (or BLX) is more easily transferred to the read data line RDD (or RDM). For this reason, the latch LT can correctly latch the low level read from the data cell DT (or mask cell MSK) onto the bit line BL (or BLX) as the logical value "0".

The readout unit 70A judges the logical value by receiving, at the latch LT, each voltage of the bit line BL (or BLX) transferred to the read data line RDD (or RDM). Hence, an operation margin of the latch LT improves more as a low-level voltage corresponding to the logical value "0" of the bit line becomes lower. In other words, the operation margin of the latch LT improves more as the length of the bit lines BL and BLX becomes shorter (or the number of word lines WLD and WLM becomes smaller).

The latch LT may operate in synchronism with the precharge signal PCHD (or PCHM) instead of operating in synchronism with the sense amplifier enable signal SAED (or SAEM). In this case, in FIG. 9, the latch LT latches the logical value of the read data signal RDD (or RDM) in synchronism with the falling edge of the precharge signal PCHD, for example.

Figure 12:
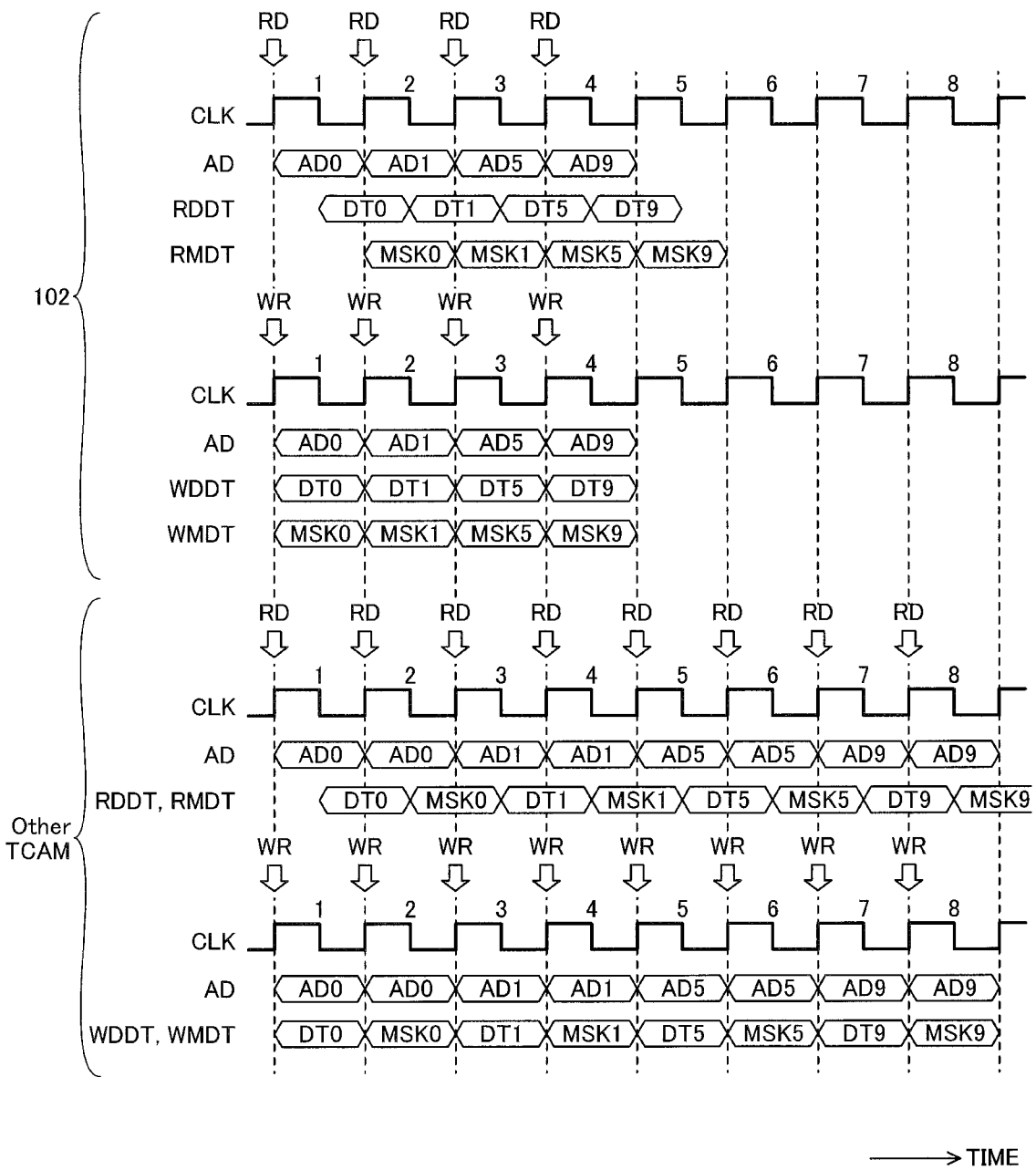
FIG. 12 is a diagram for explaining examples of effects obtainable by the second embodiment illustrated in FIG. 3 through FIG. 11.

FIG. 12 is a diagram for explaining examples of effects obtainable by the second embodiment illustrated in FIG. 3 through FIG. 11. Of course, effects similar to those illustrated in FIG. 12 are obtainable by the first embodiment illustrated in FIG. 1 and FIG. 2.

The semiconductor memory device 102 illustrated in FIG. 3 reads the data from both the data cell DT and the mask cell MSK, and outputs the read data to read data terminals RDDT and RMDT, respectively, every time the read command RD is received in synchronism with the clock signal CLK. The read command RD is received at the rising edge of the clock signal CLK, and the read data signal RDDT read from the data cell DT becomes definite in synchronism with the falling edge of the clock signal CLK. The read data signal RMDT read from the mask cell MSK becomes definite in synchronism with the rising edge of the clock signal CLK in the next clock cycle which is next to the clock cycle in which the read command RD is received at the rising edge of the clock signal CLK. The external controller or the like which makes access to the semiconductor memory device 102 receives the read data signals RDDT and RMDT from the semiconductor memory device 102, based on the rising edge of the clock signal CLK in the next clock cycle which is next to the clock cycle in which the read command RD is issued. Because the data can be read from both the data cell DT and the mask cell MSK based on a single read command, eight data read can be performed approximately in four clock cycles.

In addition, the semiconductor memory device 102 writes the write data signals WDDT and WMDT received at write data terminals WDDT and WMDT to both the data cell DT and the mas cell MSK, respectively, every time the write command WR is received in synchronism with the clock signal CLK. Because the data can be written to both the data cell DT and the mask cell MSK based on a single write command WR, eight data write can be performed approximately in four clock cycles.

On the other hand, in other TCAMs, the data is read from either the data cell DT or the mask cell MSK for every read command RD, and the data is written to either the data cell DT or the mask cell MSK for every write command WR. For this reason, approximately eight clock cycles are required to perform eight data read, and approximately eight clock cycles are required to perform eight data write. Further, because only one data can be accessed for every command RD or WR, compared to the semiconductor memory device 102 according to the second embodiment described above, the number of commands RD and WR issued in the other TCAMs increases, and the number of clock cycles used by the external controller which makes access to the other TCAMs increases.

Similar to the first embodiment illustrated in FIG. 1 and FIG. 2, the second embodiment described above in conjunction with FIG. 3 through FIG. 11 can overlap portions of the read cycles of the data read from the data cell DT and the mask cell MSK, to reduce the apparent read cycle. As a result, it is possible to improve the read access performance of the semiconductor memory device 102.

Further, by arranging the pMOS 12 between the bit line BL (or BLX) and the read data line RDD (or RDM), it is possible to start the precharge operation of the bit line BL (or BLX) simultaneously as the start of the amplifying operation of the sense amplifier SA. As a result, it is possible to reduce the judging period. In addition, the provision of the pMOS 12 can prevent the precharge voltage of the bit line BL from being transferred to the read data line RDD during the judging period, and prevent an erroneous operation of the sense amplifier SA. By initializing the voltage of the bit line BL (or BLX) to the precharge voltage of the like based on the start of the judging period, it is possible to prepare the next read period during the judging period, and reduce the read cycle.

The data can be read from both the data cell DT and the mask cell MSK based on a single read command RD. In addition, the data can be written to both the data cell DT and the mask cell MSK based on a single write command WR. The data write to the data cell DT and the mask cell MSK can be completed within the clock cycle in which the write command WR is received, and it is possible to improve the write access performance of the semiconductor memory device 102.

Accordingly to each of the embodiments described above, it is possible to improve an access performance of the semiconductor memory device having a memory cell including a first memory unit and a second memory unit.

Although the embodiments are numbered with, for example, "first," or "second," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor memory device comprising:
   a memory cell including a first memory unit and a second memory unit which are coupled to a complementary bit line pair;
   an operation controller configured to successively select the first memory unit and the second memory unit, during a read operation which reads data from the memory cell;
   a first readout circuit coupled to one of the bit line pair, and configured to judge a logical value of the data read from the selected first memory unit onto the one of the bit line pair; and
   a second readout circuit coupled to the other of the bit line pair, and configured to judge a logical value of the data read from the selected second memory unit onto the other of the bit line pair,
   wherein the operation controller consecutively performs a first read cycle in which the data is read from the first memory unit, and a second read cycle in which the data is read from the second memory unit.

2. The semiconductor memory device as claimed in claim 1,
   wherein the first read cycle includes a first read period in which the data is read from the first memory unit onto the one of the bit line pair, and a first judging period in which a logical value of the data read onto the one of the bit line pair is judged,
   wherein the second read cycle includes a second read period in which the data is read from the second memory unit onto the other of the bit line pair, and a second judging period in which a logical value of the data read onto the other of the bit line pair is judged, and
   wherein the first judging period and the second read period mutually overlap, or the second judging period and the first read period mutually overlap, when the operation controller consecutively performs the first read cycle and the second read cycle.

3. The semiconductor memory device as claimed in claim 2, further comprising:
   a first initializing circuit configured to initialize a voltage of the one of the bit line pair based on a start of the first judging period; and
   a second initializing circuit configured to initialize a voltage of the other of the bit line pair based on a start of the second judging period.

4. The semiconductor memory device as claimed in claim 3, further comprising:
   a first switch circuit arranged between the one of the bit line pair and the first readout circuit, and configured to cut off a connection between the one of the bit line pair and the first readout circuit during the first judging period; and
   a second switch circuit arranged between the other of the bit line pair and the second readout circuit, and configured to cut off a connection between the other of the bit line pair and the second readout circuit during the second judging period.

5. The semiconductor memory device as claimed in claim 4, wherein the operation controller performs a read cycle to successively read the data from the first memory unit and the second memory unit, based on a read command received from outside the semiconductor memory device.

6. The semiconductor memory device as claimed in claim 2, further comprising:
   a first switch circuit arranged between the one of the bit line pair and the first readout circuit, and configured to cut off a connection between the one of the bit line pair and the first readout circuit during the first judging period; and
   a second switch circuit arranged between the other of the bit line pair and the second readout circuit, and configured to cut off a connection between the other of the bit line pair and the second readout circuit during the second judging period.

7. The semiconductor memory device as claimed in claim 6, wherein the operation controller performs a read cycle to successively read the data from the first memory unit and the second memory unit, based on a read command received from outside the semiconductor memory device.

8. The semiconductor memory device as claimed in claim 1, further comprising:
   a first holding circuit configured to hold data to be written to the first memory unit;
   a second holding circuit configured to hold data to be written to the second memory unit;
   a selector configured to select the data held in the second holding circuit after selecting the data held in the first holding circuit, during a write operation to write the data to the memory cell; and
   a data write circuit configured to successively write the data successively selected by the selector to the first memory unit and the second memory unit via the bit line pair.

9. The semiconductor memory device as claimed in claim 8, further comprising:
   a first word line coupled to the first memory unit, and driven by the operation controller when selecting the first memory unit; and
   a second word line coupled to the second memory unit, and driven by the operation controller when selecting the second memory unit,
   wherein the data write circuit outputs the data to be written to the first memory unit to the bit line pair in accordance with a start of driving the first word line, and outputs the data to be written to the second memory unit to the bit line pair in accordance with a start of driving the second word line.

10. The semiconductor memory device as claimed in claim 9, wherein the operation controller performs a write cycle to successively write the data to the first memory unit and the second memory unit, based on a write command received from outside the semiconductor memory device.

11. The semiconductor memory device as claimed in claim 1,
    wherein the memory cell holds a logical value indicating a logical value "0", a logical value "1", or an undefined logical value, based on the data stored in the first memory unit and the data stored in the second memory unit, and
    wherein the memory cell includes a judging circuit configured to judge whether the logical value held therein and a comparison data received from outside the semiconductor memory device match when the memory cell holds the logical value "0" or "1", and to always judge a match regardless of the logical value of the comparison data when the memory cell holds the undefined logical value.

12. A control method for controlling a semiconductor memory device having a memory cell including a first memory unit and a second memory unit which are coupled to a complementary bit line pair, an operation controller, a first readout circuit coupled to one of the bit line pair, and a second readout circuit coupled to the other of the bit line pair, the control method comprising:
   successively selecting, by the operation controller, the first memory unit and the second memory unit during a read operation in which data are successively read from the memory cell;
   judging, by the first readout circuit, a logical value of the data read from the selected first memory unit onto the one of the bit line pair; and
   judging, by the second readout circuit, a logical value of the data read from the selected second memory unit onto the other of the bit line pair,
   wherein the successively selecting, by the operation controller, includes consecutively performing a first read cycle in which the data is read from the first memory unit, and a second read cycle in which the data is read from the second memory unit.

13. The control method as claimed in claim 12,
   wherein the first read cycle includes a first read period in which the data is read from the first memory unit onto the one of the bit line pair, and a first judging period in which a logical value of the data read onto the one of the bit line pair is judged,
   wherein the second read cycle includes a second period in which the data is read from the second memory unit onto the other of the bit line pair, and a second judging period in which a logical value of the data read onto the other of the bit line pair is judged, and
   wherein the first judging period and the second read period mutually overlap, or the second judging period and the first read period mutually overlap, when consecutively performing the first read cycle and the second read cycle.

14. The control method as claimed in claim 13, wherein the semiconductor memory device further has a first initializing circuit and a second initializing circuit, the control method further comprising:
   initializing, by the first initializing circuit, a voltage of the one of the bit line pair based on a start of the first judging period; and
   initializing, by the second initializing circuit, a voltage of the other of the bit line pair based on a start of the second judging period.

15. The control method as claimed in claim 14, wherein the semiconductor memory device further has a first switch circuit arranged between the one of the bit line pair and the first readout circuit, and a second switch circuit arranged between the other of the bit line pair and the second readout circuit, the control method further comprising:
   cutting off, by the first switch circuit, a connection between the one of the bit line pair and the first readout circuit during the first judging period; and
   cutting off, by the second switch circuit, a connection between the other of the bit line pair and the second readout circuit during the second judging period.

* * * * *